US007321284B2

(12) United States Patent
Chen et al.

(10) Patent No.: US 7,321,284 B2
(45) Date of Patent: Jan. 22, 2008

(54) MINIATURE THIN-FILM BANDPASS FILTER

(75) Inventors: Qiang Richard Chen, Phoenix, AZ (US); Hajime Kuwajima, Tokyo (JP)

(73) Assignee: TDK Corporation, Tokyo (JP)

( * ) Notice: Subject to any disclaimer, the term of this patent is extended or adjusted under 35 U.S.C. 154(b) by 76 days.

(21) Appl. No.: 11/345,428

(22) Filed: Jan. 31, 2006

(65) Prior Publication Data

US 2007/0176727 A1 Aug. 2, 2007

(51) Int. Cl.
*H01F 5/00* (2006.01)
*H03H 7/00* (2006.01)

(52) U.S. Cl. ...................... 336/200; 336/232; 336/223; 333/175

(58) Field of Classification Search ................ 336/200, 336/232, 223; 333/174–176; 455/338–340
See application file for complete search history.

(56) References Cited

U.S. PATENT DOCUMENTS 4,369,557 A * 1/1983 Vandebult .................. 29/25.42
4,701,727 A 10/1987 Wong
5,140,497 A 8/1992 Kato et al.
5,404,118 A 4/1995 Okamura et al.
5,777,533 A 7/1998 Kato et al.
6,020,799 A 2/2000 Ishizaki et al.
6,083,766 A 7/2000 Chen
6,097,273 A 8/2000 Frye et al.
6,268,225 B1 7/2001 Chen et al.
6,370,033 B1 * 4/2002 Saegusa et al. ............. 361/777
6,424,236 B1 7/2002 Kato
6,784,762 B2 8/2004 Kato (Continued)

FOREIGN PATENT DOCUMENTS

JP 04-150011 A 5/1992

(Continued)

OTHER PUBLICATIONS

"Microstrip Filters for RF/Microwave Applications"; Hong, J. and Lancaster, M.J.; Chapter 10, John Wiley & Sons Inc., 2001.

(Continued)

*Primary Examiner*—Anh Mai
(74) *Attorney, Agent, or Firm*—Allen J. Moss; Alex Starkovich; Squire, Sanders & Dempsey LLP

(57) ABSTRACT

A bandpass filter includes at least two thin-film layers, a first resonant circuit including a first inductor, and a second resonant circuit including a second inductor. In one embodiment, the first inductor comprises a coil having a counter-clockwise rotation positioned in two or more of the at least two thin-film layers and the second inductor comprises a coil having a clockwise rotation positioned in two or more of the at least two thin-film layer. In this case, the first inductor is coupled to the second inductor in at least one of the at least two thin-film layers when the bandpass filter is energized. In another embodiment, the first inductor has a clockwise rotation and the second has a counter-clockwise rotation positioned. In this case, the first inductor is coupled to the second inductor in at least two of the at least two thin-film layers when the bandpass filter is energized.

24 Claims, 24 Drawing Sheets

U.S. PATENT DOCUMENTS

| | | | | |
|---|---|---|---|---|
| 7,023,299 | B2 * | 4/2006 | Shoji | 333/185 |
| 7,064,629 | B2 * | 6/2006 | Shoji | 333/185 |
| 2004/0263309 | A1 * | 12/2004 | Ito et al. | 336/200 |

FOREIGN PATENT DOCUMENTS

| | | | |
|---|---|---|---|
| JP | 10-051203 | A | 2/1998 |
| JP | 10-075144 | A | 3/1998 |
| JP | 2005-072063 | A | 3/2005 |

OTHER PUBLICATIONS

"A Compact Second-Order LTCC Bandpass Filter with Two Finite Transmission Zeros" Kun, L. and Ke-Li, W. IEEE Transactions on Microwave Theory and Techniques, vol. 51, No. 2, Feb. 2003.

"Design of Multi-Stage Combline BPF in Laminated Structure," Ikuo Awai et al., Proceedings of APMC2001, Taipei, Taiwan, R.O.C., pp. 735-740.

"Microstrip Tapped-Line Filter Design," Joseph S. Wong, IEEE Transactions on Microwave Theory and Techniques, vol. MTT-27, No. 1 Jan. 1979, pp. 44-50.

"Microwave Filters, Impedance-Matching Networks, and Coupling Structures," Matthaei et al., Artech House Books, Dedham, MA, pp. 497-506, no date given.

* cited by examiner

MINIATURE THIN-FILM BANDPASS FILTER

FIELD OF THE INVENTION

The present invention relates to a bandpass filter, and more specifically to a miniature thin-film bandpass filter.

BACKGROUND OF THE INVENTION

In recent years, marked advances in the miniaturization of mobile communication terminals, such as mobile phones and Wireless LAN (Local Area Network) routers, has been achieved due to the miniaturization of the various components incorporated therein. One of the most important components incorporated in a communication terminal is the filter.

In particular, bandpass filters are often used in communication applications for blocking or filtering signals with frequencies outside a certain passband. In such applications, bandpass filters preferably exhibit low insertion loss and steep roll-off attenuation at passband edges (i.e., the upper and lower frequencies of the range that are not highly attenuated by the filter). Out-band rejection or attenuation is an important parameter for a bandpass filter. It measures the filter's capability of discriminating in-band and out-band signals. The bigger the out-band rejection and the wider the rejected bandwidth, normally the better the filter. Also, the steeper the rolloff frequency edge between pass-band and out-band, the better the filter. To achieve rapid rolloff, more resonant circuits or more filter sections are typically required. This generates more transmission zeros at out-bands, leading to higher order of out-band attenuation. Unfortunately, using more sections and resonant circuits increases filter dimensions and a filter's insertion loss in the pass-band. This is not helpful for the miniature requirement in modern wireless communication systems.

For example, conventionally, low-loss high quality factor microwave resonator circuits are used to achieve steep roll-off attenuation. Microwave resonator circuits typically utilize quarter-wavelength or half-wavelength transmission line structures in order to realize low losses at microwave frequency. For lower gigahertz wireless applications, quarter-wave or half-wavelength structures demand large component size in order to accommodate the transmission line structures. Such large components are unsatisfactory for use in smaller electronic devices.

SUMMARY OF THE INVENTION

In view of the foregoing, the invention provides a miniature thin-film bandpass filter. More particularly, according to aspects of the invention, the invention provides a bandpass filter for miniature application employing thin-film elements, including spiral (coil) inductors and parallel plate capacitors.

According to one embodiment of the invention, the bandpass filter is a two resonant tank bandpass filter optimized for lower profile and higher performance using thin-film technology. The resonant tanks utilize coiled inductors. In this way, the transmission zeros of the filter can be shifted from one side of the passband to the other side based on the orientation of the inductor coils to one another. In addition, coiled inductors provide for a lower profile and smaller component size than conventional transmission line structures.

According to one embodiment of the invention, the bandpass filter includes at least two thin-film layers, a first resonant circuit including a first inductor, and a second resonant circuit including a second inductor. The first inductor comprises a coil having a counter-clockwise rotation positioned in two or more of the at least two thin-film layer and the second inductor comprises a coil having a clockwise rotation positioned in two or more of the at least two thin-film layers. The first inductor is coupled to the second inductor in at least one of the at least two thin-film layers when the bandpass filter is energized.

In this embodiment, the coupling between the first and second inductors may be relatively low. As such, the frequency response of the filter has two transmission zeros on the lower passband side. Accordingly, the frequency response on the lower passband side exhibits a steeper rolloff and more attenuation.

According to another embodiment of the invention, the bandpass filter includes at least two thin-film layers, a first resonant circuit including a first inductor, and a second resonant circuit including a second inductor. The first inductor comprises a coil having a clockwise rotation positioned in two or more of the at least two thin-film layer and the second inductor comprises a coil having a counter-clockwise rotation positioned in two or more of the at least two thin-film layers. The first inductor is coupled to the second inductor in at least two of the at least two thin-film layers when the bandpass filter is energized.

In this embodiment, the coupling between the first and second inductors may be relatively high. As such, the frequency response of the filter has a transmission zero on the lower passband side and a transmission zero on the upper passband side. As such, the frequency response exhibits similar rolloff attenuation characteristics on both sides of the passband.

It is to be understood that the descriptions of this invention herein are exemplary and explanatory only and are not restrictive of the invention as claimed.

DESCRIPTION OF THE EMBODIMENTS

Reference will now be made in detail to the present exemplary embodiments of the invention, examples of which are illustrated in the accompanying drawings.

The invention provides a bandpass filter that utilizes two or more coiled inductors. By altering the orientation of the inductors to each other, transmission zeros of the filter can be shifted from one side of the passband to the other.

An inductor coil has increased magnetic flux through its central core when compared with transmission lines. As compared to transmission lines, the use of inductor coils opens another dimension of controlling its coupling property with neighboring structure by changing the coil rotation direction and choosing different coil sides for coupling. The proposed filter has the advantage of shifting a transmission zero from one side of the passband to the other simply by flipping the inductor direction and/or orientation. This allows for modification of filter performance to suit required specifications. Such a filter structure may be achieved with only two-resonant LC (inductor-capacitor) tanks and is smaller in size when compared with other structures using three distributed resonators with similar performance. Preferably, the bandpass filter of the invention includes two inductor-capacitor resonant circuits made up of C1 and L1 and are coupled to each other by the mutual coupling of the L1 inductors and by capacitive coupling through another capacitor (C3).

Figure 1A:
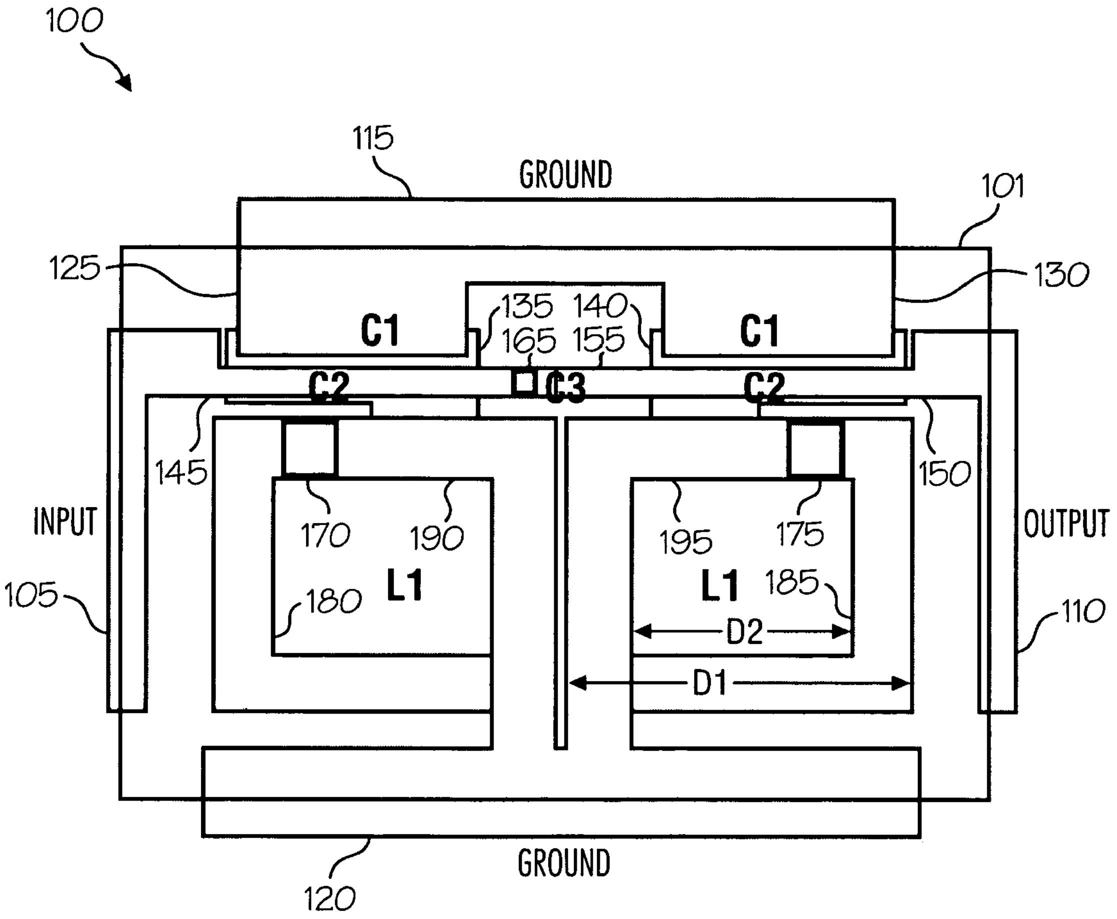
FIG. 1A depicts a physical layout of a bandpass filter with higher inductor coupling according to one embodiment of the invention.

FIG. 1A depicts a physical layout of a bandpass filter with higher inductor coupling according to one embodiment of the invention. As shown in FIG. 1A, bandpass filter layout 100 includes two thin-film layers. Metal regions 105, 110, 115, 120, 125, 130, 145, 150, 155, 190, and 195 are contained in a top thin-film layer (see FIG. 1B). Metal regions 135, 140, 160, 180 and 185 are contained in a bottom thin-film layer (see FIG. 1C). Vias 165, 170, and 175 connect metal regions in the top layer to metal regions in the bottom layer.

Metal regions 105 and 110 are the input and output terminals of the bandpass filter respectively. Metal regions 115 and 120 are the ground terminals. The portions of these terminals that are outside the filter package when manufactured are shown by line 101.

Connected to metal region 105 (input) is metal region 145. Metal region 145, together with metal region 135 on the bottom layer, forms a capacitor (C2). Metal region 135 is also used to form a capacitor (C1) with metal region 125. Metal region 125 is connected to metal region 115 (ground).

Metal region 135 (C1/C2) also connects to metal region 180 on the bottom layer. Metal region 180 forms part of the coil of inductor (L1). Metal region 180 connects to metal region 190 on the upper layer through via 170. Metal region 190 forms the remainder of the coil of the inductor (L1). Metal region 190 connects to ground at metal region 120.

Moving to the right side of the layout, metal region 145 (C2) connects to metal region 160 on the lower layer through via 165. Metal region 160, together with metal region 155 on the upper layer, forms a capacitor (C3). Metal region 155 connects to metal region 150. Metal region 150, together with metal region 140 on the bottom layer, forms a capacitor (C2). This capacitor has substantially the same capacitance value as the capacitor formed by metal regions 145 and 135. Metal region 140 is also used to form a capacitor (C1) with metal region 130 on the upper layer. This capacitor has substantially the same capacitance value as the capacitor formed by metal regions 125 and 135. Metal region 130 (C1) connects to ground at metal region 115. Metal region 150 (C2) connects to the output terminal at metal region 110.

Metal region 140 (C1/C2) also connects to metal region 185 on the bottom layer. Metal region 185 forms part of the coil of inductor (L1). Metal region 185 connects to metal region 195 on the upper layer through via 175. Metal region 195 forms the remainder of the coil of the inductor (L1). The inductance of the coil formed by metal regions 185 and 195 is substantially the same as the inductance of the coil formed by metal regions 180 and 190. Metal region 195 connects to ground at metal region 120.

Figure 1B:
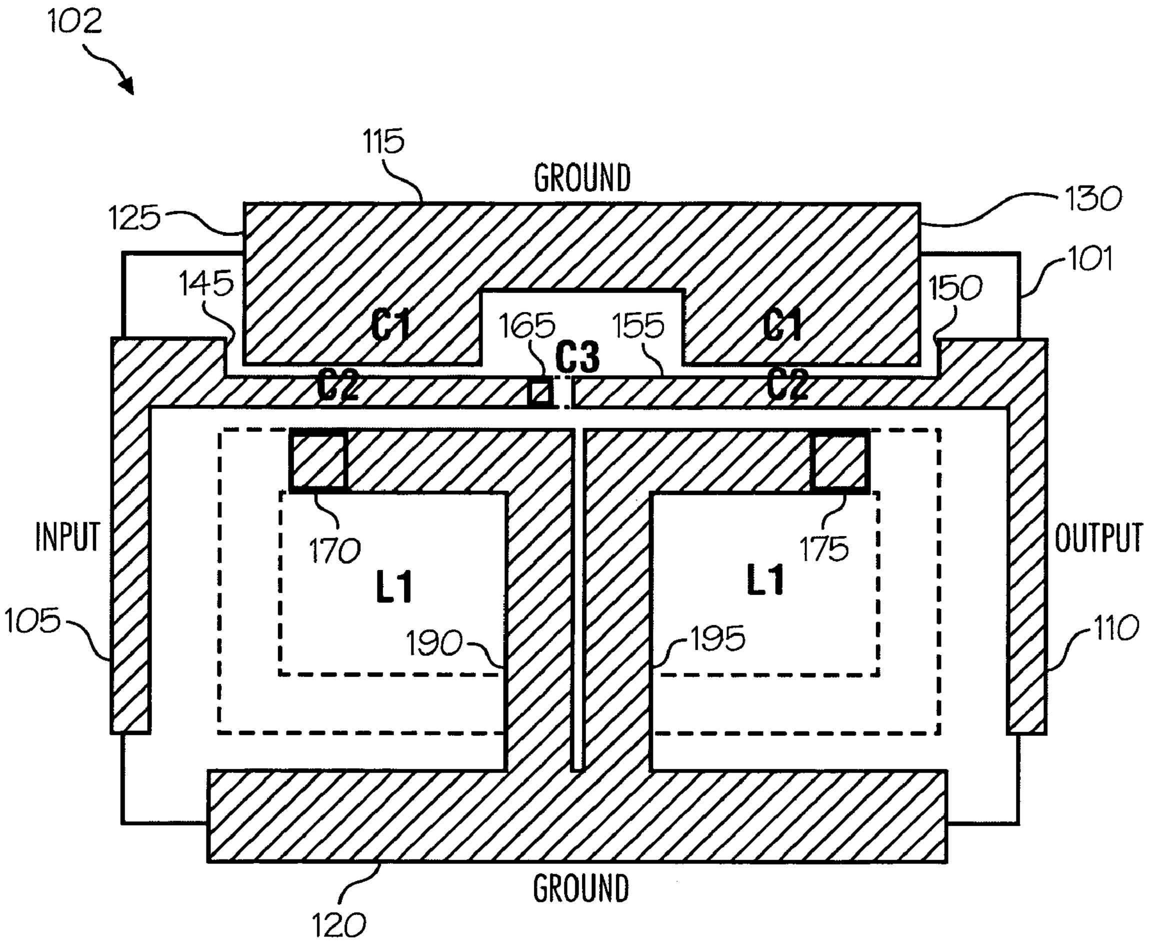
FIG. 1B depicts a physical layout of the top layer of the bandpass filter shown in FIG. 1A according to one embodiment of the invention.

FIG. 1B shows the top layer 102 of layout 100. As shown, metal regions 190 and 195 have portions that are relatively close together, separated only by a small gap. For example, the gap may be 10 μm in an application for a 2.4 GHz filter with a 0.72 mm long by 0.5 mm wide package size using a thin-film manufacturing process. As such, when in use (i.e., when the filter is energized), the inductors formed with metal regions 190 and 195 become more highly coupled to each other in the upper layer.

Figure 1C:
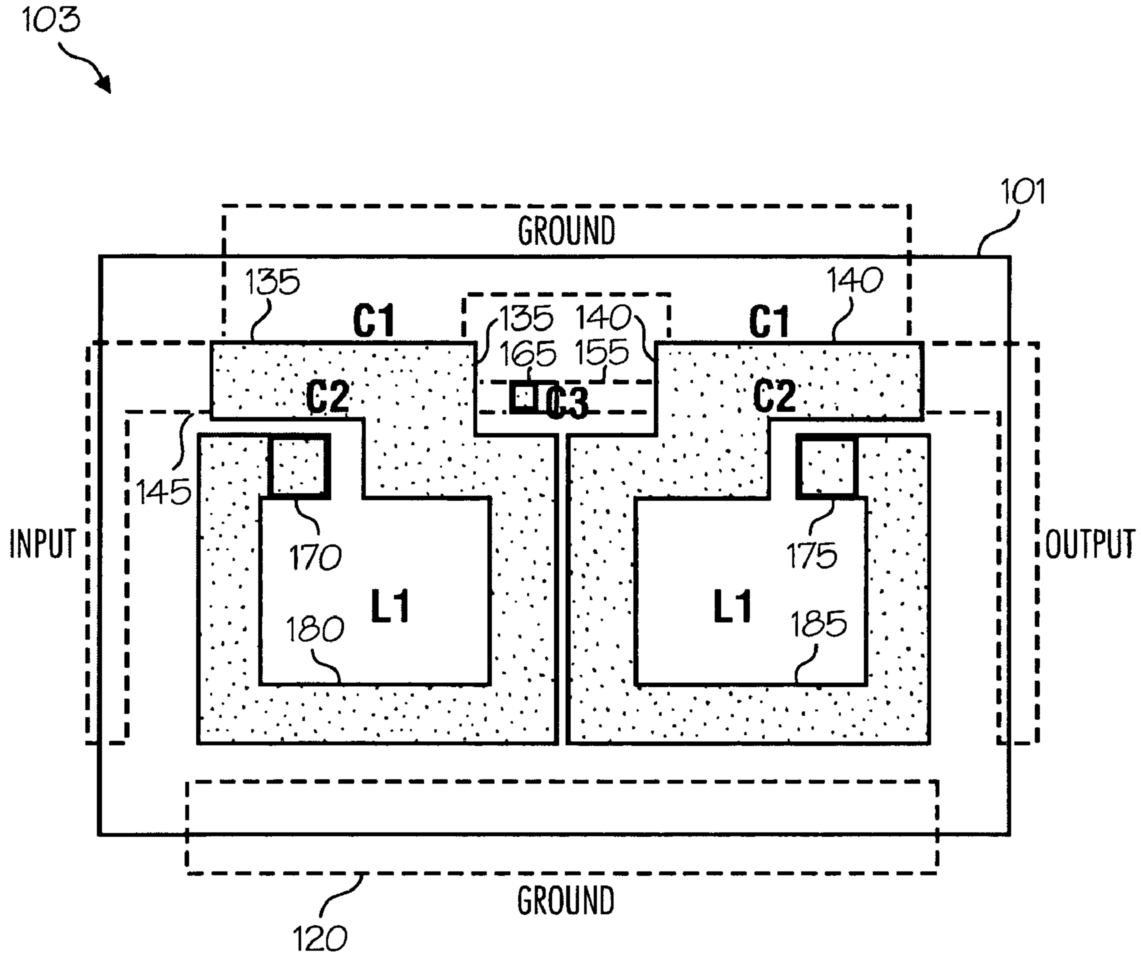
FIG. 1C depicts a physical layout of the bottom layer of the bandpass filter shown in FIG. 1A according to one embodiment of the invention.

FIG. 1C depicts shows the bottom layer 103 of layout 100. As shown, metal regions 180 and 185 have portions that are relatively close together, separated only by a small gap. Again, as one example, the gap may be 10 μm in an application for a 2.4 GHz filter with a 0.72 mm long by 0.5 mm wide package size using a thin-film manufacturing process. As such, when in use (i.e., when the filter is energized), the inductors formed with metal regions 180 and 185 become more highly coupled to each other in the lower layer. As such, the layout of bandpass filter 100 includes two inductors that become coupled to each other in two layers when energized.

This two layer coupling is accomplished by utilizing substantially symmetrical inductor coil shapes with mirrored orientation. In particular, the left inductor coil L1 formed by metal regions 180 and 190 has a clockwise rotation, while the right inductor coil L1 formed by metal regions 185 and 195 has a counter-clockwise rotation. The rotation for the inductor coils is defined by the direction an electrical signal will flow through the coil on its way to ground.

As such, in the left inductor L1, an electrical signal first enters the coil in metal region 180 on the bottom layer from metal region 135 (C1/C2). The electrical signal would flow in a clockwise direction around metal region 180 to via 170 (see FIG. 1C). Then the signal would move through via 170 to metal region 190 and continue to move in a clockwise direction to ground at metal region 120 (see FIG. 1B).

In the right inductor L1, the electrical signal first enters the coil in metal region 185 on the bottom layer from metal region 140 (C1/C2). The electrical signal would flow in a counter-clockwise direction around metal region 185 to via 175 (see FIG. 1C). Then the signal would move through via 175 to metal region 195 and continue to move in a counter-clockwise direction to ground at metal region 120 (see FIG. 1B).

As shown in FIGS. 1A to 1C, direction of rotation of the inductors coils goes from a bottom layer to a top layer. However, coil direction may go from the top layer to the bottom layer depending on the layout of the ground, input, output and other components. In addition, the invention is not limited to bandpass filters having only two layers. More than two layers are acceptable as well. All that is required is at least two thin-film layers and at least two resonant circuits each with inductors, where the inductors are coupled in at least one of the thin-film layers.

FIGS. 1A to 1C show the inductors using a rectangular-shaped coil. Such a shape allows for easy layout of the metal regions. However, any shape of coil may be used. The coil may be triangular, rectangular with rounded corners, elliptical, circular, or any polygonal shape.

Preferably, each of the inductors coils has an outer diameter (D1) of 260 μm, core diameter (D2) of 160 μm, and the width of the metal trace is preferably 50 μm in an application for a 2.4 GHz filter with a 0.72 mm long by 0.5 mm wide package size using a thin-film manufacturing process. However, any diameter or trace width may be used to obtain a coil with the desired inductance and quality factor. Maximum inductor quality factor may be achieved by optimizing core size, inductor coil width, metallization material and thickness, and coil shape. In the example of a 2.4 GHz filter mentioned above, 8 μm thick (i.e., height of metal layer) copper is used for inductor coils with core diameter (D2) of 160 μm.

Figure 2:
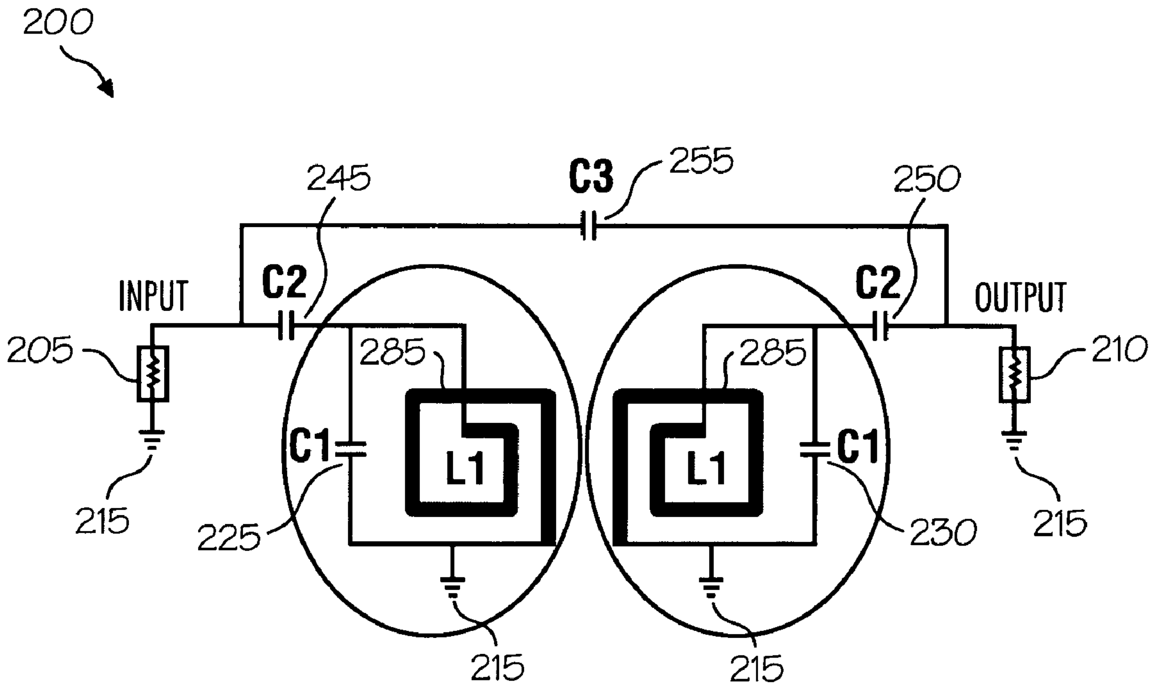
FIG. 2 depicts a schematic, including inductor orientation, of a bandpass filter with higher inductor coupling according to one embodiment of the invention.

FIG. 2 depicts a schematic, including inductor orientation, of the bandpass filter layout shown in FIG. 1A. Bandpass filter schematic 200 includes capacitors 245 and 250 (C2), capacitors 225 and 230 (C1), capacitor 255 (C3), and inductors 280 and 285 (L1). Capacitors 245 and 255 are connected to input terminal 205. Capacitor 245 is connected to a first resonant circuit that includes capacitor 225 connected in parallel with inductor 280.

On the right side, capacitors 255 and 250 are connected to output terminal 210. Capacitor 250 is also connected to a second resonant circuit that includes capacitor 230 in parallel with inductor 285. As shown, inductor 280 has a clockwise rotation while inductor 285 has a counter-clockwise rotation. This orientation allows for two sections of the inductor coils to be coupled to each other when the filter is energized.

Figure 3:
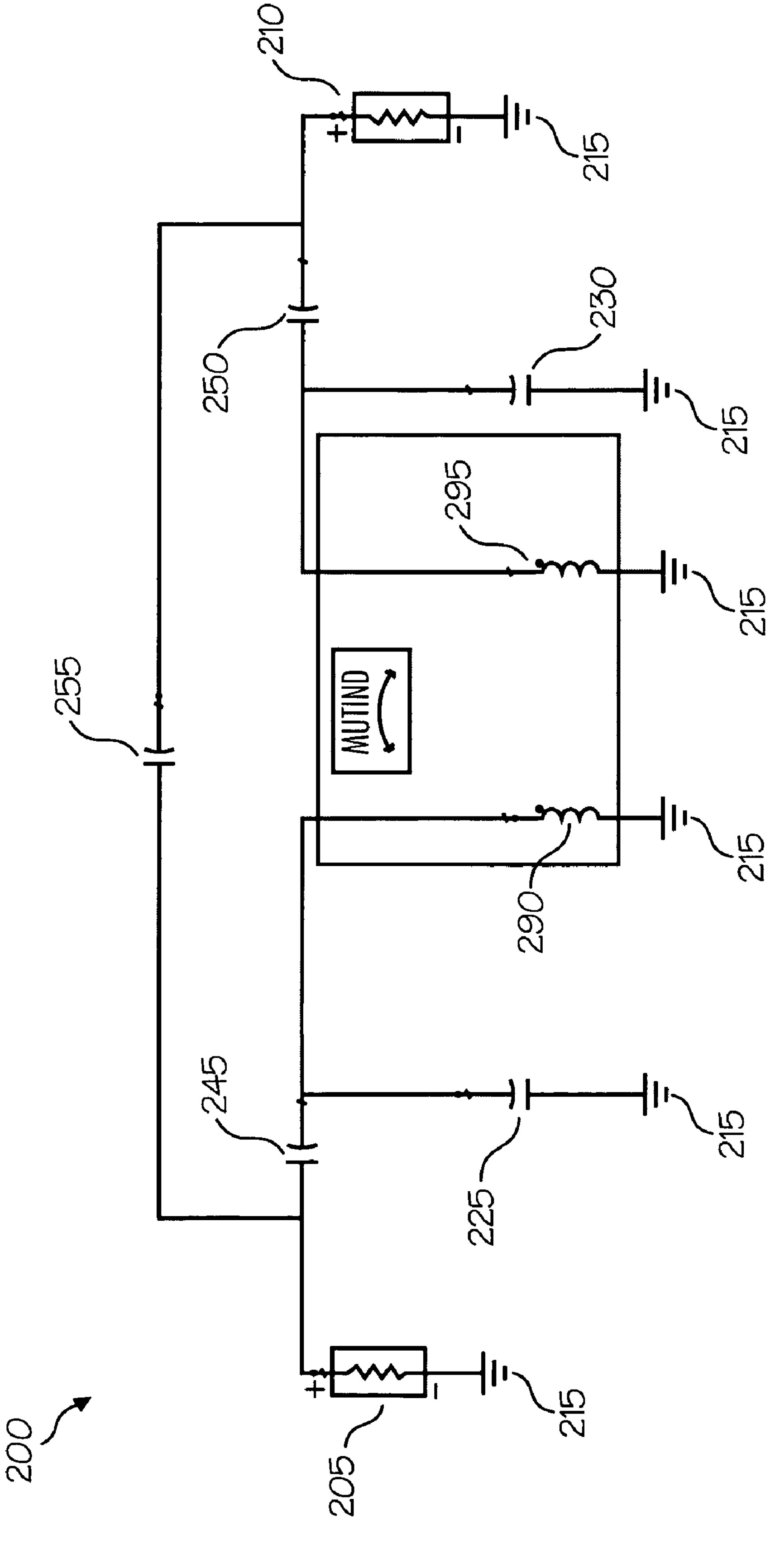
FIG. 3 depicts a schematic of a bandpass filter with higher inductor coupling according to one embodiment of the invention.

FIG. 3 shows a schematic, including component values, for the layout shown in FIG. 1A. The component values shown in FIG. 3 are for a bandpass filter with a passband at about 2.4 GHz. However, these values are only exemplary. The values of the components in the filter may be changed to any value to suit applications in any passband range. As shown, in FIG. 3 capacitors 245 and 250 (C2) have a value of 1.5 pf, capacitors 225 and 230 (C1) have a value of 3.0 pf, capacitor 255 (C3) has a value of 0.3 pf, and inductors 290 and 295 (L1) have a value of 1.3 nH. As shown in FIG. 3, when the bandpass filter is energized, the inductors 290 and 295 (when laid out as shown in FIGS. 1A to 1C) exhibit a mutual coupling inductance of 0.26 nH.

Figure 4:
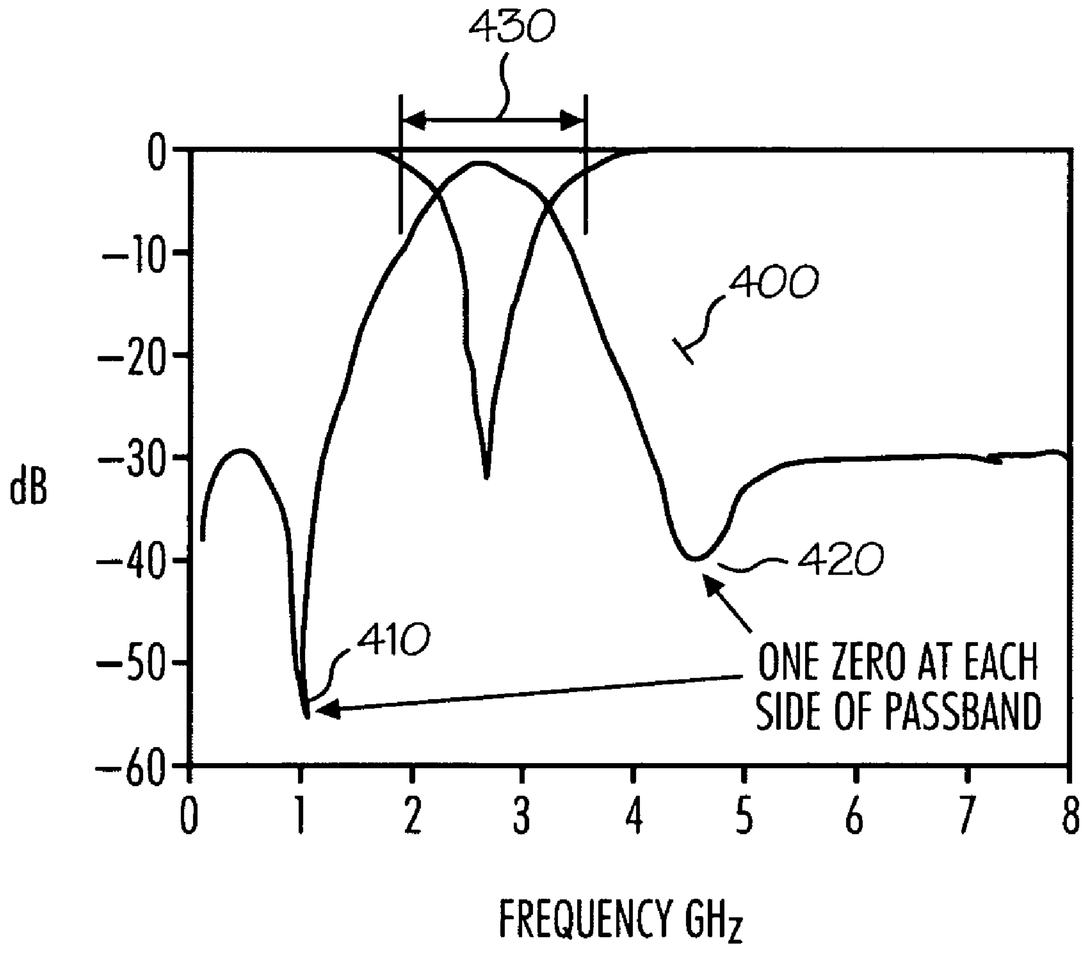
FIG. 4 depicts a frequency response of a bandpass filter with higher inductor coupling according to one embodiment of the invention.

FIG. 4 depicts a frequency response of a bandpass filter with the layout of FIGS. 1A to 1C and component values of FIG. 3. In this configuration, frequency response 400 has a passband 430 between approximately 2.0 to 3.0 GHz. Frequency response 400 includes a transmission zero 410 at the lower side of passband 430 and a transmission zero 420 at the upper side of passband 430.

In addition to space saving advantages, the coil structures of the inductors allows for control over the frequency response of the filters. By flipping over the inductor coils and keeping them in a symmetric fashion, transmission zero for the filter can be shifted from the upper out-band to the lower out-band. This allows the filter to have steep attenuation property at the lower edge of pass-band when compared with the performance shown in FIG. 4. This feature is useful for attenuating interfering signals close to lower passband.

Figure 5A:
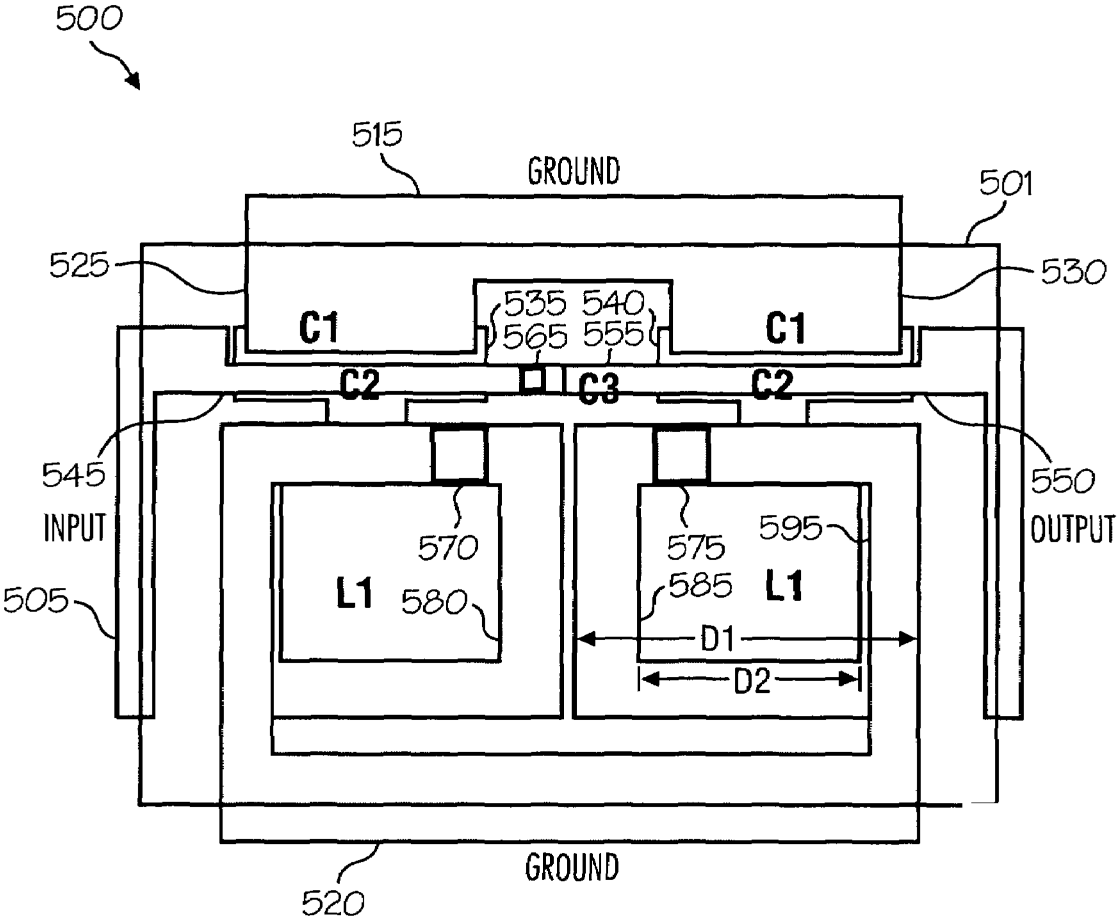
FIG. 5A depicts a physical layout of a bandpass filter with lower inductor coupling according to one embodiment of the invention.

FIG. 5A depicts a physical layout of a bandpass filter inductor coils that are flipped as compared to the filter layout shown in FIG. 1A. As shown in FIG. 5A, bandpass filter layout 500 includes two thin-film layers. Metal regions 505, 510, 515, 520, 525, 530, 545, 550, 555, 590, and 595 are contained in a top thin-film layer (see FIG. 5B). Metal regions 535, 540, 560, 580 and 585 are contained in a bottom thin-film layer (see FIG. 5C). Vias 565, 570, and 575 connect metal regions in the top layer to metal regions in the bottom layer.

Metal regions 505 and 510 are the input and output terminals of the bandpass filter respectively. Metal regions 515 and 520 are the ground terminals. The portions of these terminals that are outside the filter package when manufactured are shown by line 501.

Connected to metal region 505 (input) is metal region 545. Metal region 545, together with metal region 535 on the bottom layer, forms a capacitor (C2). Metal region 535 is also used to form a capacitor (C1) with metal region 525. Metal region 525 is connected to metal region 515 (ground).

Metal region 535 (C1/C2) also connects to metal region 580 on the bottom layer. Metal region 580 forms part of the coil of inductor (L1). Metal region 580 connects to metal region 590 on the upper layer through via 570. Metal region 590 forms the remainder of the coil of the inductor (L1). Metal region 590 connects to ground at metal region 520.

Moving to the right side of the layout, metal region 545 (C2) connects to metal region 560 on the lower layer through via 565. Metal region 560, together with metal region 555 on the upper layer, forms a capacitor (C3). Metal region 555 connects to metal region 550. Metal region 550, together with metal region 540 on the bottom layer, forms a capacitor (C2). This capacitor has substantially the same capacitance value as the capacitor formed by metal regions 545 and 535. Metal region 540 is also used to form a capacitor (C1) with metal region 530 on the upper layer. This capacitor has substantially the same capacitance value as the capacitor formed by metal regions 525 and 535. Metal region 530 (C1) connects to ground at metal region 515. Metal region 550 (C2) connects to the output terminal at metal region 510.

Metal region 540 (C1/C2) also connects to metal region 585 on the bottom layer. Metal region 585 forms part of the coil of inductor (L1). Metal region 585 connects to metal region 595 on the upper layer through via 175. Metal region 595 forms the remainder of the coil of the inductor (L1). The inductance of the coil formed by metal regions 585 and 595 is substantially the same as the inductance of the coil formed by metal regions 580 and 590. Metal region 595 connects to ground at metal region 520.

Figure 5B:
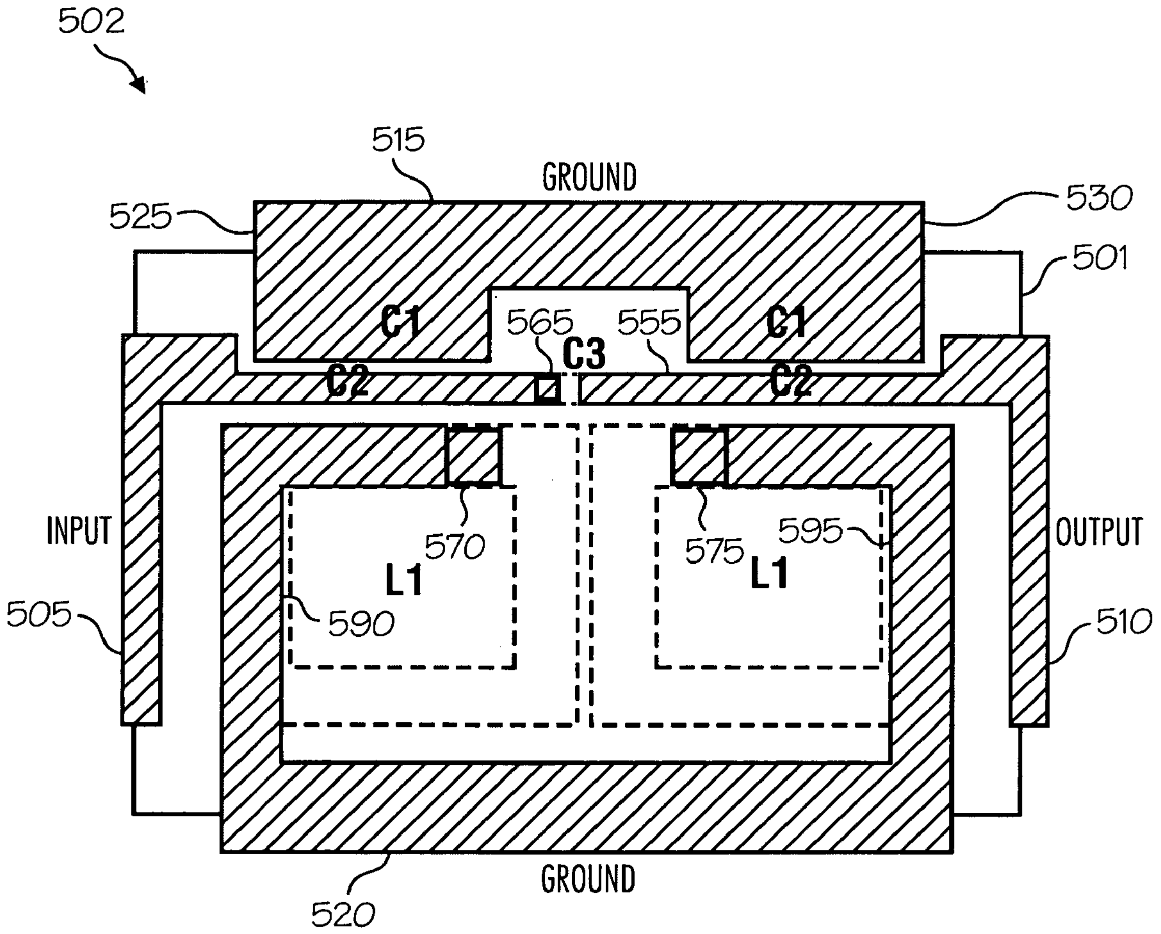
FIG. 5B depicts a physical layout of the top layer of the bandpass filter shown in FIG. 5A according to one embodiment of the invention.

FIG. 5B shows the top layer 502 of layout 500. As shown, metal regions 590 and 595 do not have portions that are relatively close together. As such, as opposed to the layout shown in FIGS. 1A to 1C when in use (i.e., when the filter is energized), the inductors formed with metal regions 590 and 595 have relatively low or no coupling to each other in the upper layer.

Figure 5C:
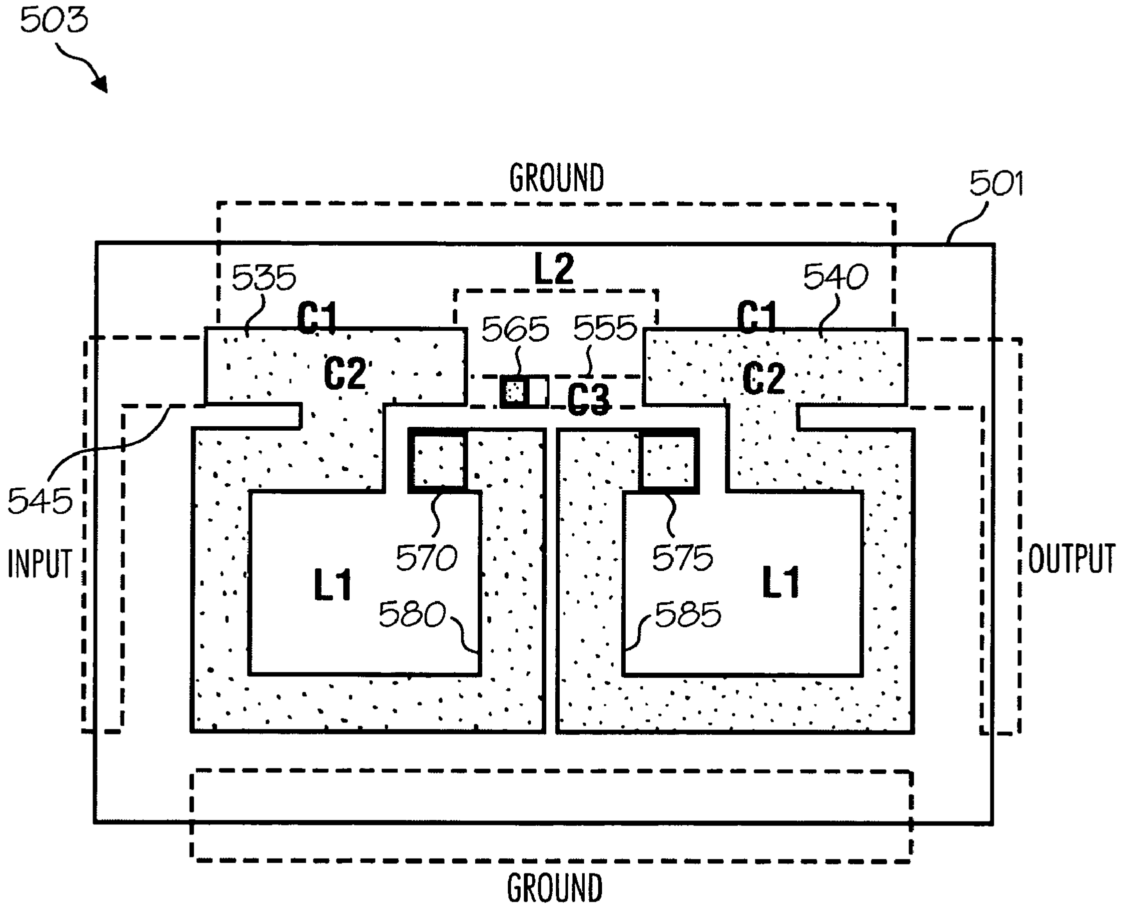
FIG. 5C depicts a physical layout of the bottom layer of the bandpass filter shown in FIG. 5A according to one embodiment of the invention.

FIG. 5C depicts shows the bottom layer 503 of layout 500. As shown, metal regions 580 and 585 have portions that are relatively close together, separated only by a small gap. For example, the gap may be 15 μm in an application for a 2.4 GHz filter with a 0.72 mm long by 0.5 mm wide package size using a thin-film manufacturing process. As such, when in use (i.e., when the filter is energized), the inductors formed with metal regions 580 and 585 become more highly coupled to each other in the lower layer. As such, the layout of bandpass filter 500 includes two inductors that become more highly coupled to each other in one layer when energized.

This one layer coupling is accomplished by utilizing substantially symmetrical inductor coil shapes with an orientation that is "flipped" from the orientation shown in FIGS. 1A to 1C. In particular, the left inductor coil L1 formed by metal regions 580 and 590 has a counter-clockwise rotation, while the right inductor coil L1 formed by metal regions 585 and 595 has a clockwise rotation. Again, the rotation for the inductors coils is defined by the direction an electrical signal will flow through the coil on its way to ground.

As such, in the left inductor L1, an electrical signal first enters the coil in metal region 580 on the bottom layer from metal region 535 (C1/C2). The electrical signal would flow in a counter-clockwise direction around metal region 580 to via 570 (see FIG. 1C). Then the signal would move through via 570 to metal region 590 and continue to move in a counter-clockwise direction to ground at metal region 520 (see FIG. 5B).

In the right inductor L1, the electrical signal first enters the coil in metal region 585 on the bottom layer from metal region 540 (C1/C2). The electrical signal would flow in a clockwise direction around metal region 585 to via 575 (see FIG. 5C). Then the signal would move through via 575 to metal region 595 and continue to move in a clockwise direction to ground at metal region 520 (see FIG. 5B).

As shown in FIGS. 5A to 5C, direction of rotation of the inductors coils goes from a bottom layer to a top layer. Again, however, coil direction may go from the top layer to the bottom layer depending on the layout of the ground, input, output and other components. In addition, the invention is not limited to bandpass filters having only two layers. Two or more layers are acceptable as well. All that is required is at least two thin-film layers and at least two resonant circuits each with inductors, where the inductors are coupled in at least one of the thin-film layers.

Again, FIGS. 5A to 5C show the inductors using a rectangular-shaped coil. Such a shape allows for easy layout of the metal regions. However, any shape of coil may be used. The coil may be triangular, rectangular with rounded corners, elliptical, circular, or any polygonal shape.

Preferably, each of the inductors coils has an outer diameter (D1) of 260 μm, core diameter (D2) of 160 μm, and the width of the metal trace is preferably 50 μm in an application for a 2.4 GHz filter with a 0.72 mm long by 0.5 mm wide package size using a thin-film manufacturing process. However, any diameter or trace width may be used to obtain a coil with the desired inductance and quality factor. Maximum inductor quality factor may be achieved by optimizing core size, inductor coil width, metallization material and thickness, and coil shape. In the example of a 2.4 GHz filter mentioned above, 8 μm thick (i.e., height of metal layer) copper is used for inductor coils with core diameter (D2) of 160 μm.

Figure 6:
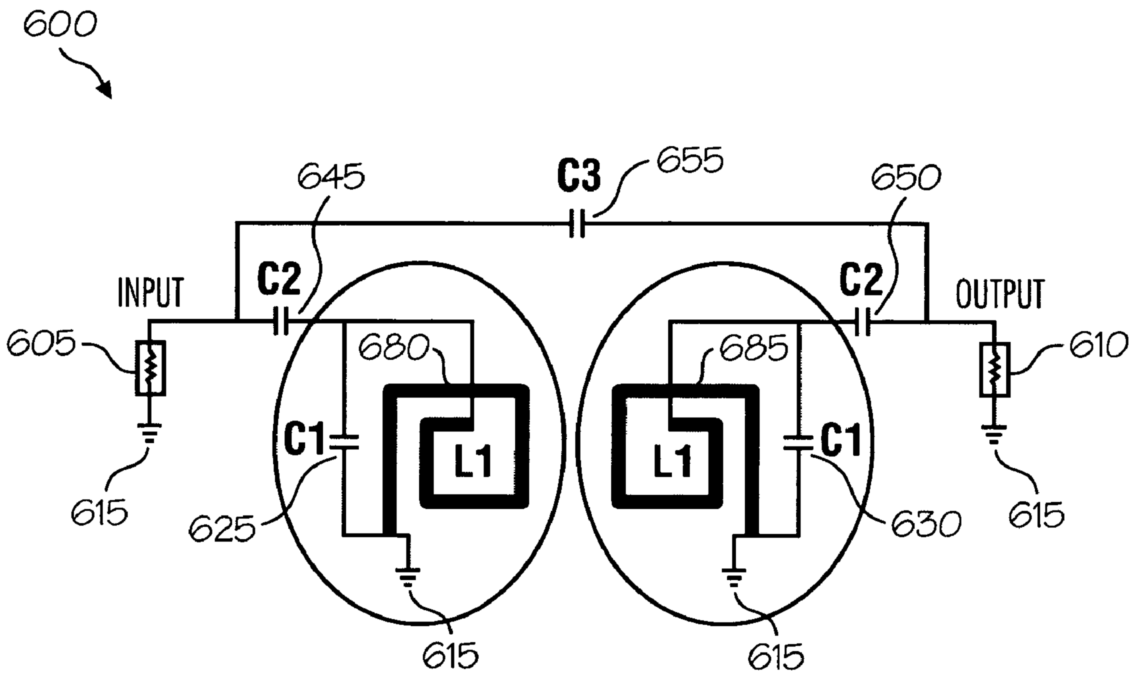
FIG. 6 depicts a schematic, including inductor orientation, of a bandpass filter with lower inductor coupling according to one embodiment of the invention.

FIG. 6 depicts a schematic, including inductor orientation, of the bandpass filter layout shown in FIG. 5A. Bandpass filter schematic 600 includes capacitors 645 and 650 (C2), capacitors 625 and 630 (C1), capacitor 655 (C3), and inductors 680 and 685 (L1). Capacitors 645 and 655 are connected to input terminal 605. Capacitor 645 is connected to a first resonant circuit that includes capacitor 625 connected in parallel with inductor 680.

On the right side, capacitors 655 and 650 are connected to output terminal 610. Capacitor 650 is also connected to a second resonant circuit that includes capacitor 630 in parallel with inductor 685. As shown, inductor 680 has a counter-clockwise rotation while inductor 685 has a clockwise rotation. This orientation allows for one section of the inductor coils to be coupled to each other when the filter is energized.

Figure 7:
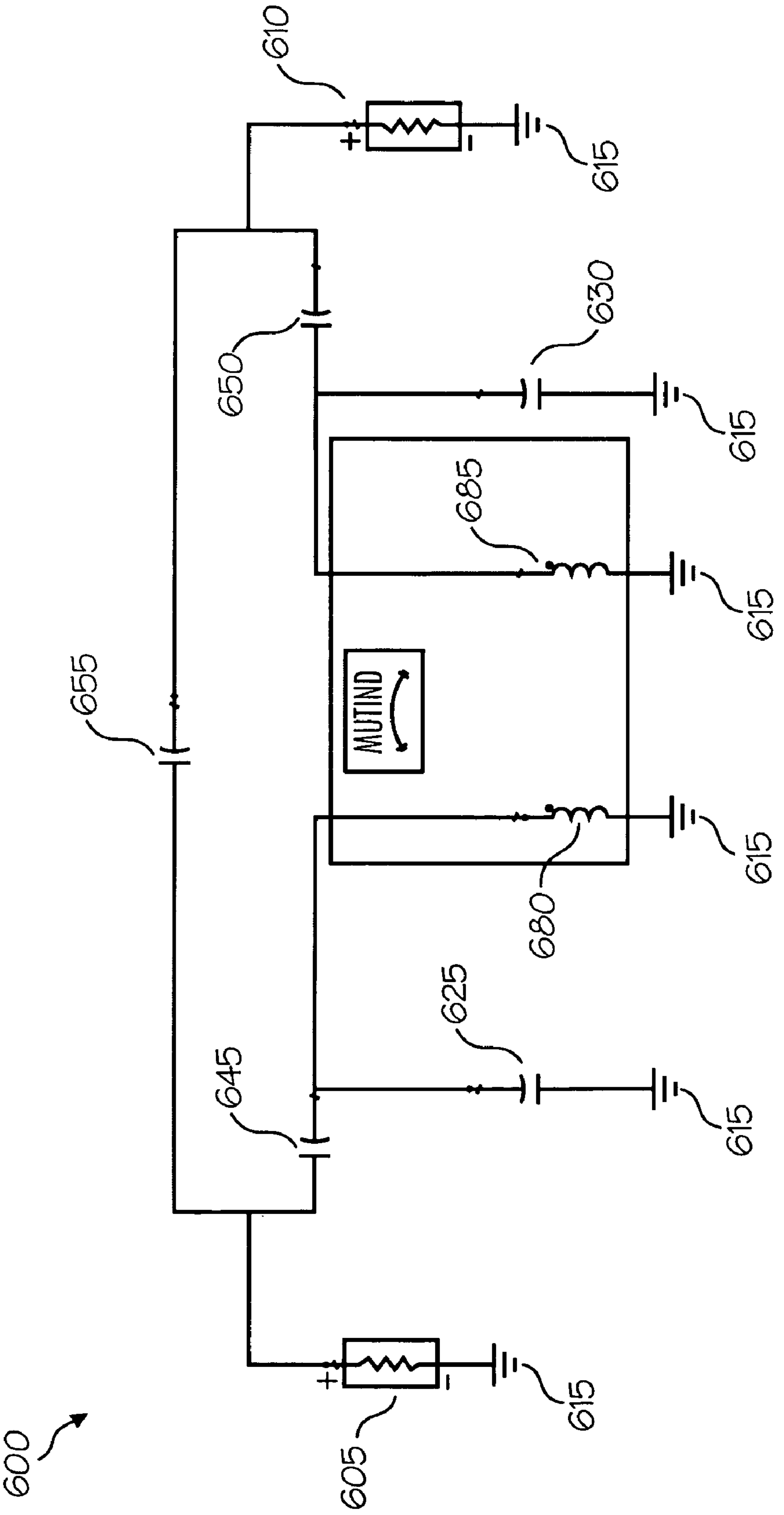
FIG. 7 depicts a schematic of a bandpass filter with lower inductor coupling according to one embodiment of the invention.

FIG. 7 shows a schematic, including component values, for the layout shown in FIG. 5A. The component values shown in FIG. 7 are for a bandpass filter with a passband at about 2.4 GHz. However, these values are only exemplary. The values of the components in the filter may be changed to any value to suit applications in any passband range. As shown, in FIG. 7 capacitors 645 and 650 (C2) have a value of 3.5 pf, capacitors 625 and 630 (C1) have a value of 3.0 pf, capacitor 655 (C3) has a value of 1.2 pf, and inductors 680 and 685 (L1) have a value of 0.9 nH. As shown in FIG. 7, when the bandpass filter is energized, the inductors 680 and 685 (when laid out as shown in FIGS. 5A to 5C) exhibit a relatively low mutual coupling inductance of 0.001 nH.

Figure 8:
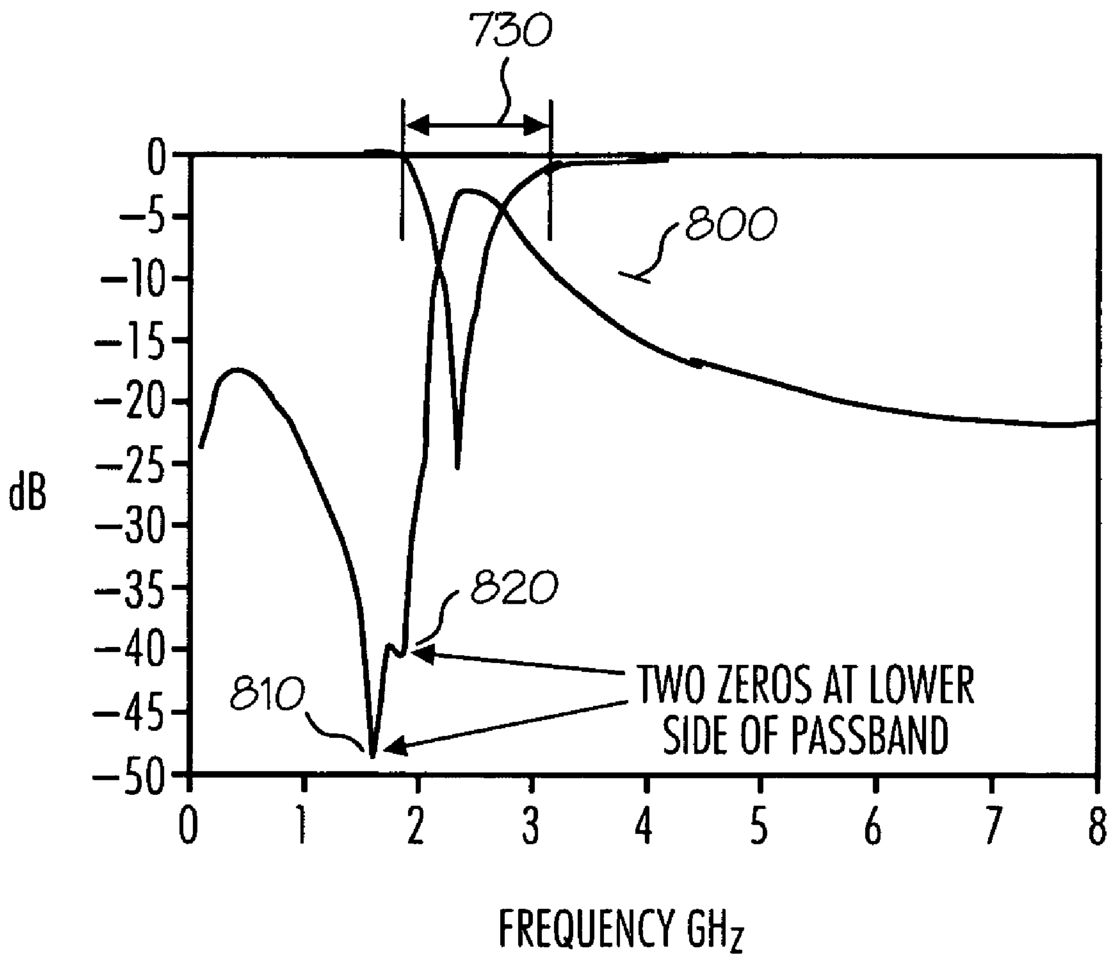
FIG. 8 depicts a frequency response of a bandpass filter with lower inductor coupling according to one embodiment of the invention.

FIG. 8 depicts a frequency response of a bandpass filter with the layout of FIGS. 5A to 5C and component values of FIG. 7. In this configuration, frequency response 800 has a passband 430 between approximately 2.2 to 2.7 GHz. Frequency response 800 includes two transmission zeros 810 and 820 at the lower side of passband 830 and no transmission zero at the upper passband side.

Figure 9:
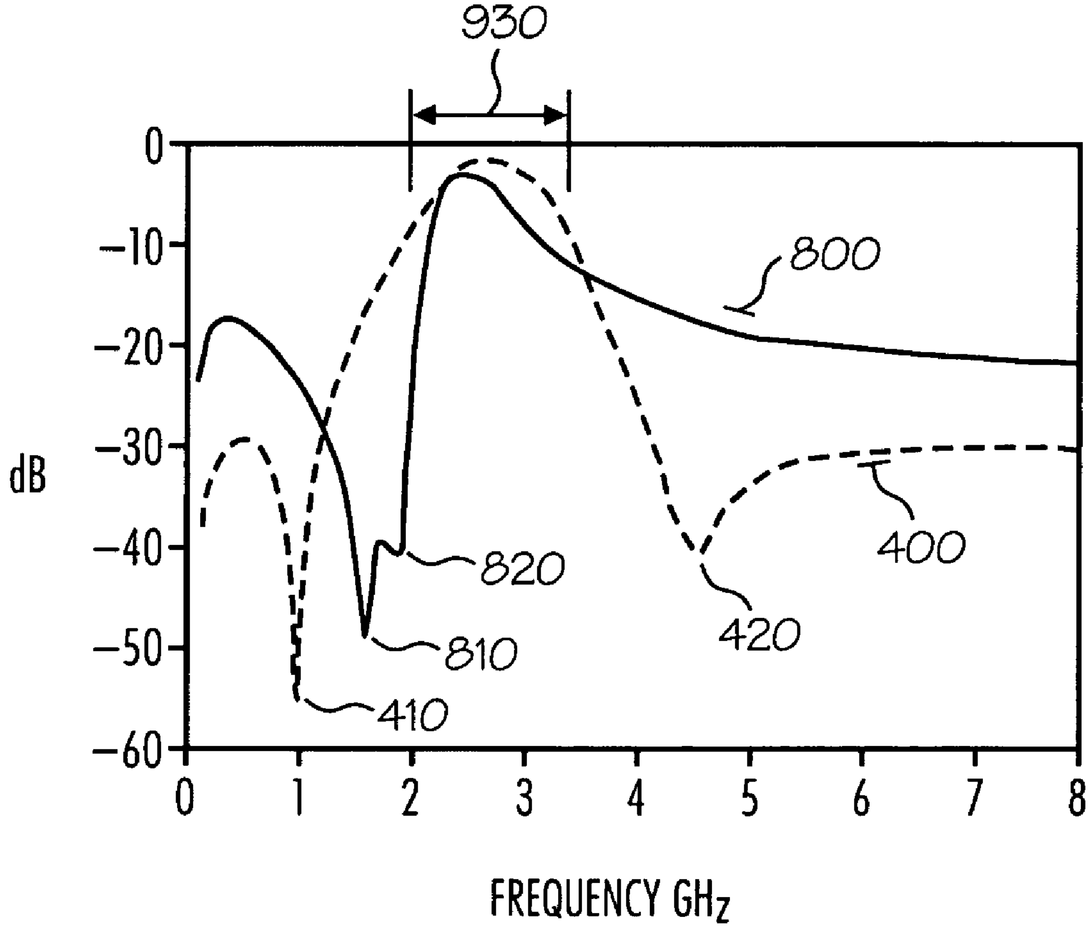
FIG. 9 depicts a comparison of a frequency response for a bandpass filter with higher inductor coupling and a bandpass filter with lower inductor coupling according to one embodiment of the invention.

FIG. 9 depicts a comparison of a frequency response for a bandpass filter with higher inductor coupling and a bandpass filter with lower inductor coupling according to one embodiment of the invention. As can be seen in FIG. 9, frequency 800 (lower inductor coupling) has a considerably steeper rolloff and increased attenuation on the lower side of passband 930 as compared to frequency response 400 (higher inductor coupling). However, frequency response exhibits steeper rolloff and higher attenuation on the upper side of passband 930. As such, the configuration that has greater inductor coupling (FIGS. 1A to 1C) may be more beneficial for applications that will benefit from strong attenuation on both sides of the passband. On the other hand, the configuration that has lesser inductor coupling (FIGS. 5A to 5C) may be more beneficial for applications that will benefit from an even steeper rolloff and greater attenuation on the lower passband, and where out-band performance on the upper side of the passband is less critical.

Figure 10:
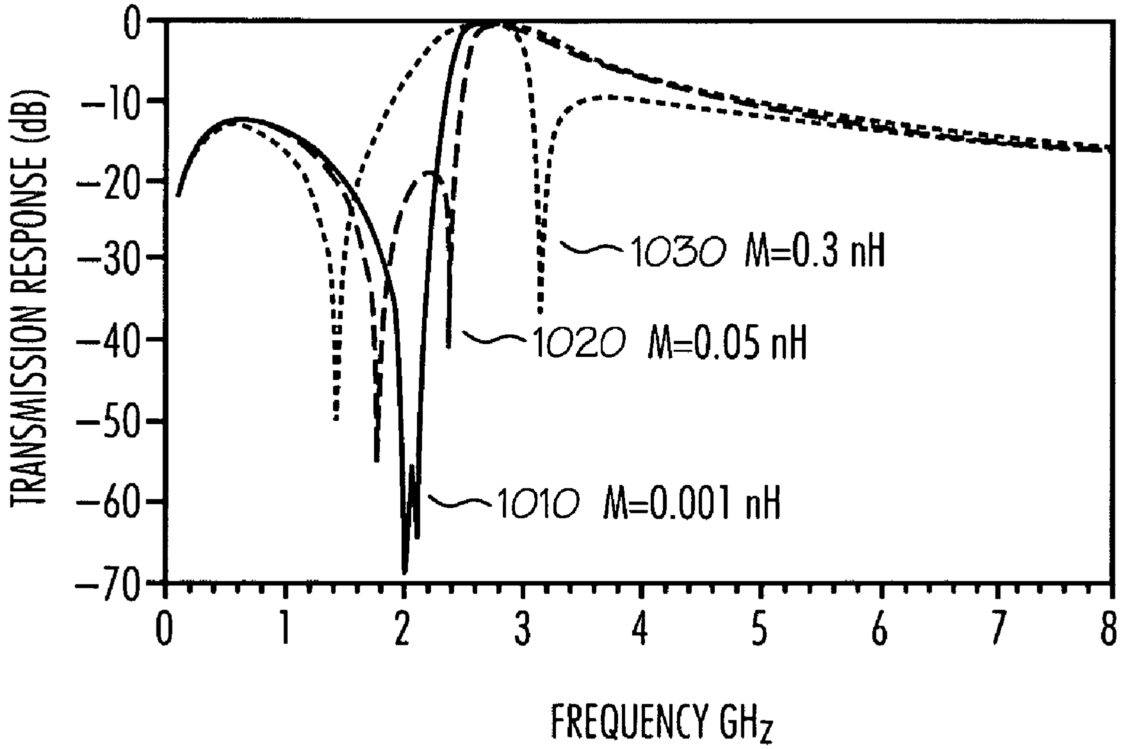
FIG. 10 depicts frequency responses of a bandpass filter with varying coupling inductance values according to one embodiment of the invention.

FIG. 10 depicts frequency responses of a bandpass filter according to the invention at varying mutual coupling values. Frequency response 1010 shows the response of the bandpass filter when the mutual coupling between the inductor coils is 0.001 nH. This response is similar to the response shown in FIG. 8. Frequency response 1030 shows the response of the bandpass filter when the mutual coupling between the inductor coils is 0.3 nH. This response is similar to the response shown in FIG. 4. Frequency response 1020 shows the response for inductor value of 0.05 nH, between that of response 1010 and 1030. This chart shows that as the mutual coupling of the inductors is increased, a transmission zero is moved from the upper side of the passband to the lower side, and as such a steeper rolloff and increased attenuation can be achieved on the lower passband side.

Figure 11:
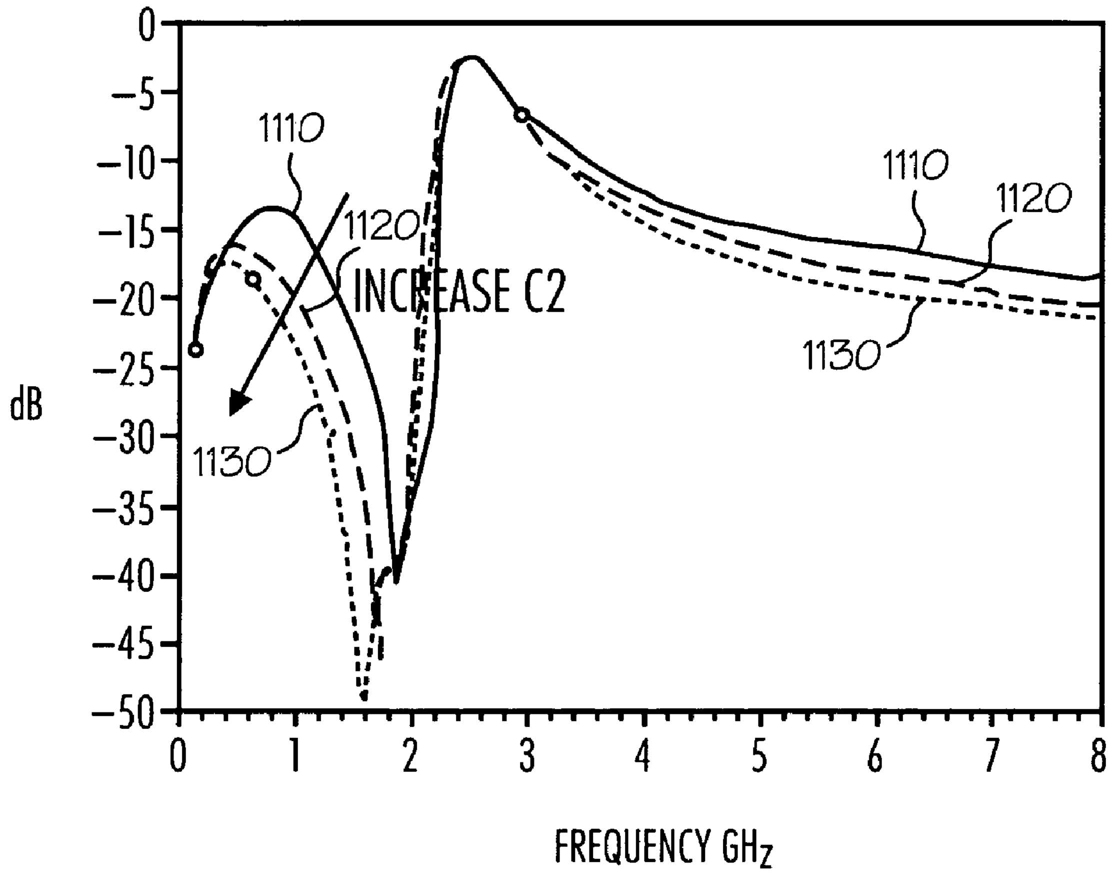
FIG. 11 depicts frequency responses of a bandpass filter with varying capacitance values according to one embodiment of the invention.

FIG. 11 depicts frequency responses of the lower inductor coil coupling bandpass filter with varying capacitance values. By varying the values of the C2 capacitors (645 and 650 in FIG. 7), greater attenuation can be achieved in the lower stop-band. Frequency response 1110 represents a frequency response of the bandpass filter of FIGS. 5A to 7 with a C2 capacitance value of 2.5 pF. Frequency response 1120 represents a frequency response of the bandpass filter of FIGS. 5A to 7 with a C2 capacitance value of 3.5 pF. Frequency response 1130 represents a frequency response of the bandpass filter of FIGS. 5A to 7 with a C2 capacitance value of 4.5 pF.

Figure 12A:
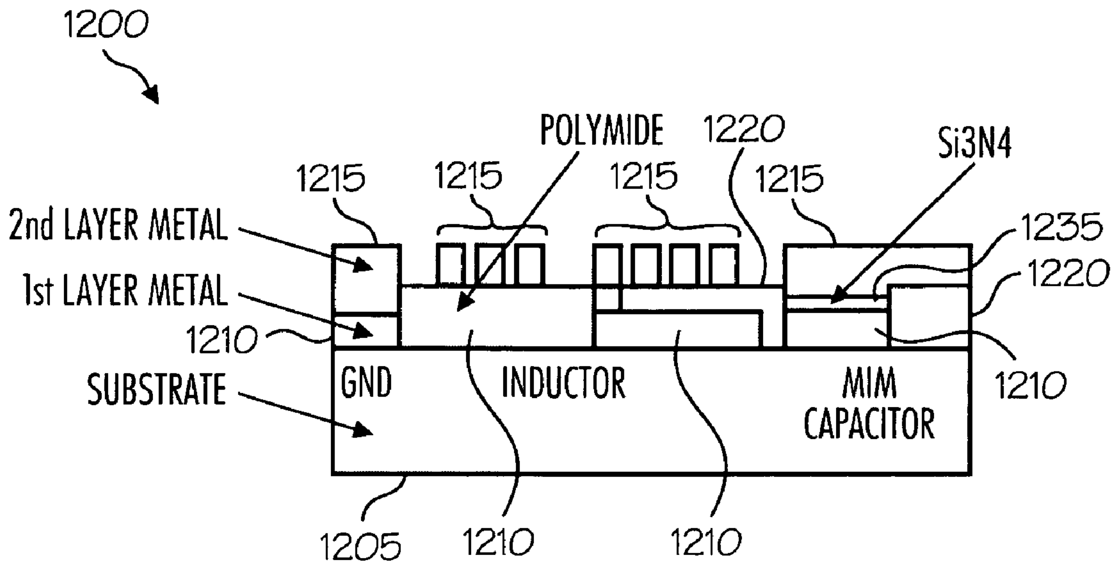
FIG. 12A depicts a cross section of a bandpass filter with inductors on a top layer according to one embodiment of the invention.
Figure 12B:
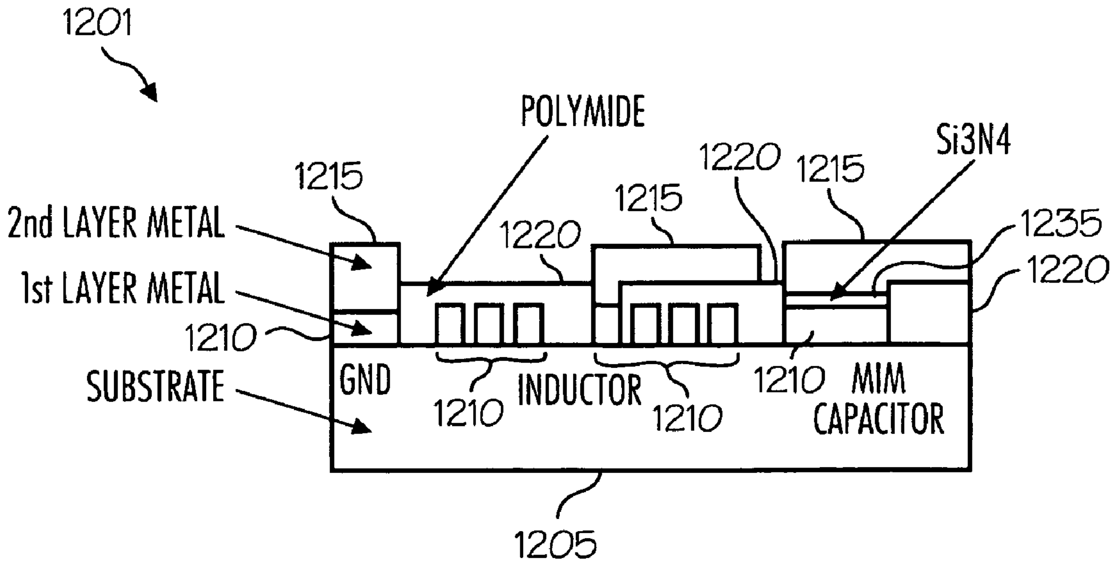
FIG. 12B depicts a cross section of a bandpass filter with inductors on a bottom layer according to one embodiment of the invention.

FIGS. 12A and 12B depict cross sections of a bandpass filter structures showing the inductors on a top layer and on a bottom lawyer, respectively. Bandpass filter structures 1200 and 1201 include a substrate 1205, a first metal layer 1210, a second metal layer 1215, and insulator layer 1220, a capacitor dielectric 1235.

The substrate is preferably made of a low dissipation loss material, such as ceramic, sapphire, quartz, gallium arsenide (GaAs), or a high-resistivity silicon, but may be other material such as glass or low-resistivity silicon. The first and second metal layers are preferably made of copper, but may be gold, aluminum or other materials with suitable conductive properties. The insulator is preferably made of polyimide, but may be other material such as silicon oxide, photoresist materials, or other materials with suitable insulative properties. The capacitor dielectric is preferably made of silicon nitride ($Si_3N_4$), but may be any type of dielectric useful for making metal-insulator-metal (MIM) capacitors including alumina, silicon oxide, etc.

The metal, insulator, and dielectric layers are preferably applied to the substrate using any conventional thin-film process. Examples of such processes include plating, chemical vapor deposition, plasma-enhanced chemical vapor deposition, thermal evaporation, electron beam evaporator, sputtering, pulsed laser deposition, molecular beam epitaxy, reactive sputtering, chemical etching and dry etching. However, any technique for creating thin-films may be utilized. A thin-film process can be any process by which the thicknesses of the layers can be controlled to within a few nanometers down to a few atoms.

Figure 13:
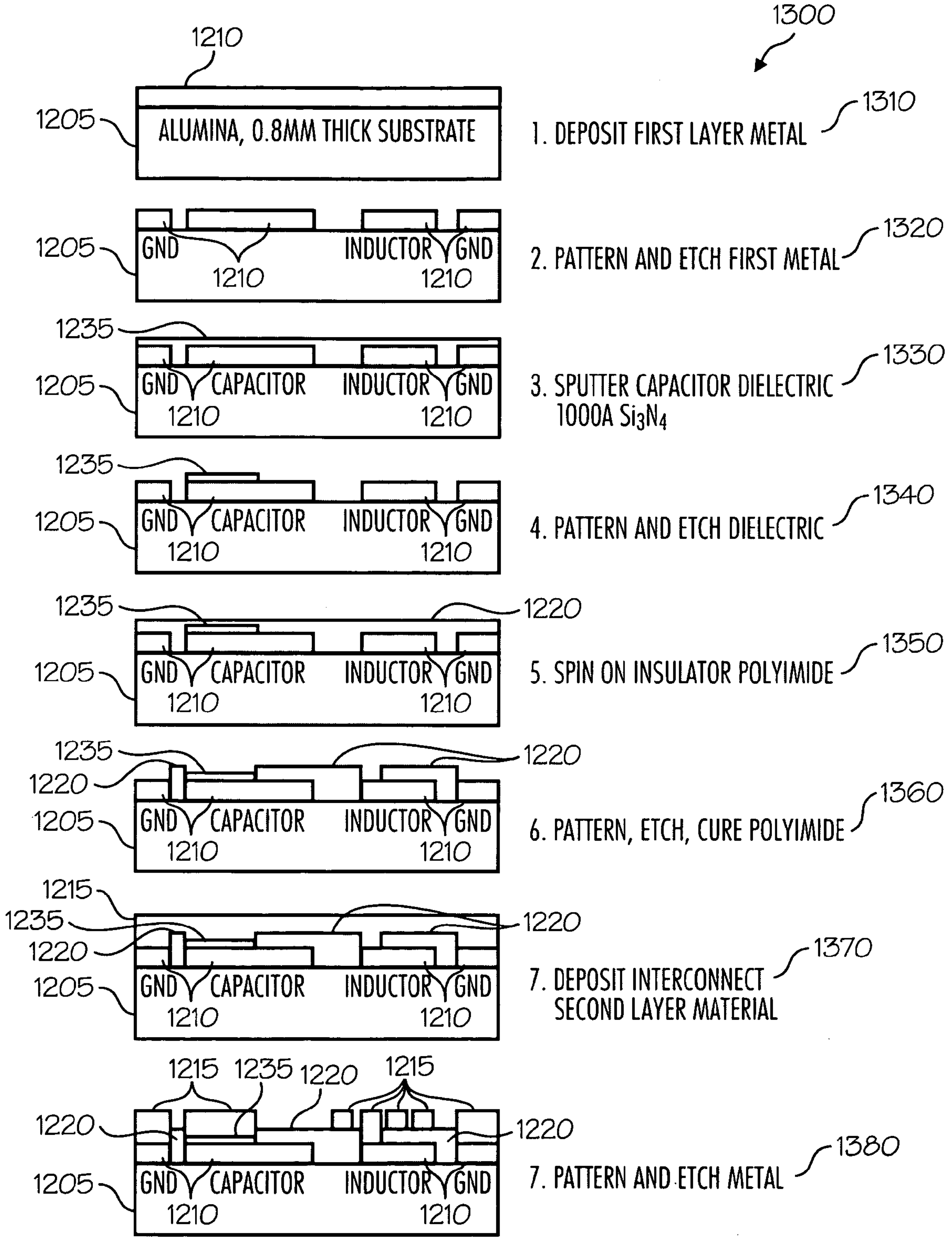
FIG. 13 depicts a method for manufacture of a bandpass filter with inductors on a top layer according to one embodiment of the invention.

FIG. 13 shows one example method of manufacturing a bandpass filter as shown in FIG. 12A. First, in step 1310 a first metal layer 1210 is deposited on substrate 1205. Preferably, the substrate is 300 to 1000 μm. The metal layer is preferably 2 to 10 μm thick. The metal may be deposited using any thin-film technique but is preferably deposited by sputtering or plating. In step 1320, a pattern is applied to the first metal layer and the first metal layer is etched away to form the desired layout. Next, in step 1330 the capacitor dielectric 1235 is sputtered onto the substrate and first metal layer. Preferably, the dielectric thickness is between 0.1 to 0.15 μm. In step 1340, a pattern is placed on the dielectric and it is etched to achieve the desired layout. Next, in step 1350 insulator 1220 is spun onto the substrate, first metal layer, and capacitor dielectric. Preferably, the insulator is between 5 to 8 μm thick. In step 1360, a pattern is placed on insulator 1220 and the insulator is etched away to form the desired layout. Step 1360 may also include a process to cure the insulator. Next, in step 1370 a second metal layer 1215 is deposited on the first metal layer, capacitor dielectric, and insulator. The second metal layer is preferably 5 to 10 μm thick. Finally, in step 1380 a pattern is placed on second metal layer 1215 and the second metal layer is etched away to form the desired pattern.

The ranges of thickness described above are not absolute requirements, but merely represent preferred ranges for manufacturing filters that operate in the lower gigahertz range. Larger or smaller thicknesses could be employed for use in other applications.

Figure 14:
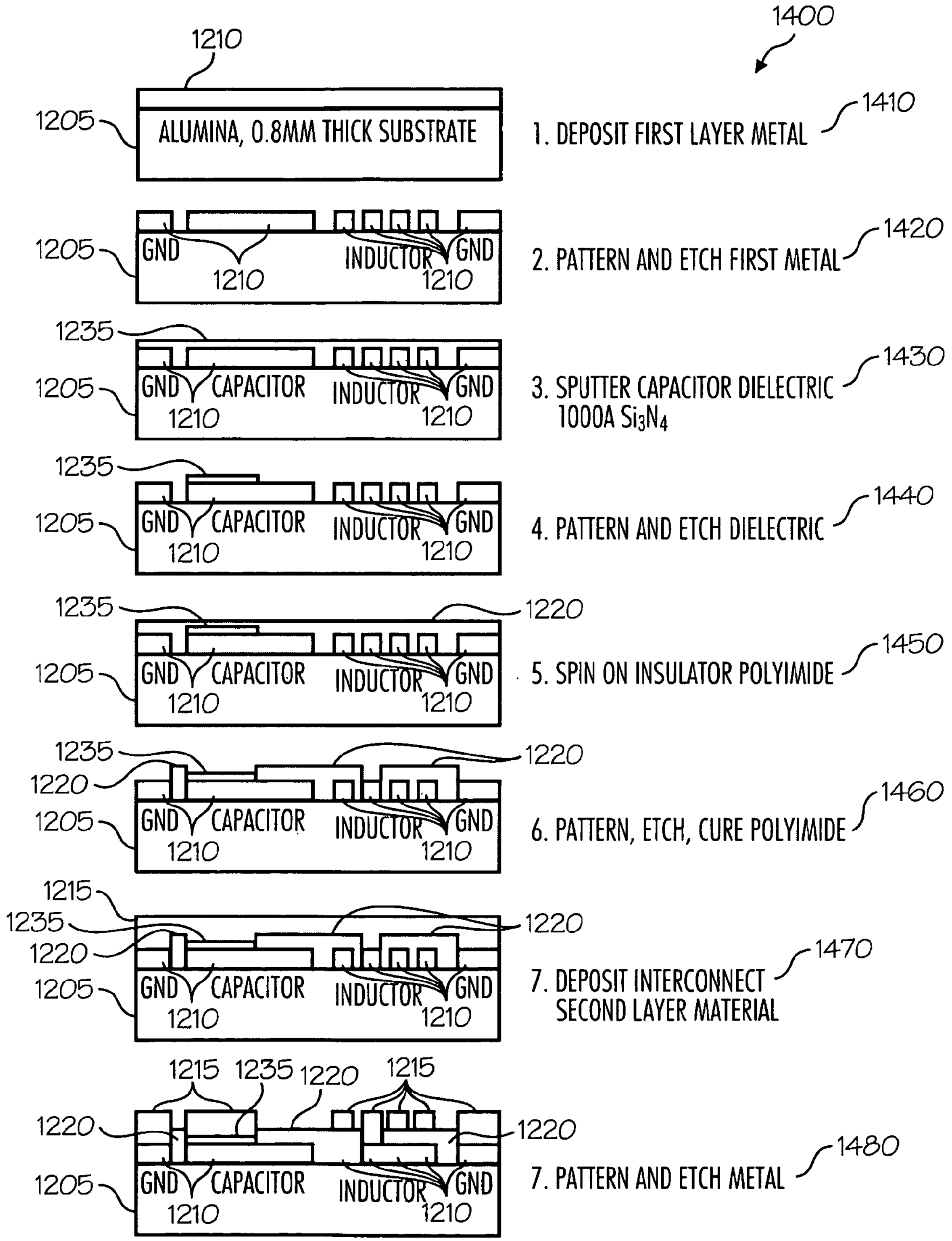
FIG. 14 depicts a method for manufacture of a bandpass filter with inductors on a bottom layer according to one embodiment of the invention.

FIG. 14 shows a method of manufacture identical to that in FIG. 13 except that the representative bandpass filter has a different pattern layout. This pattern is similar to the one shown in FIG. 12B.

Figure 15:
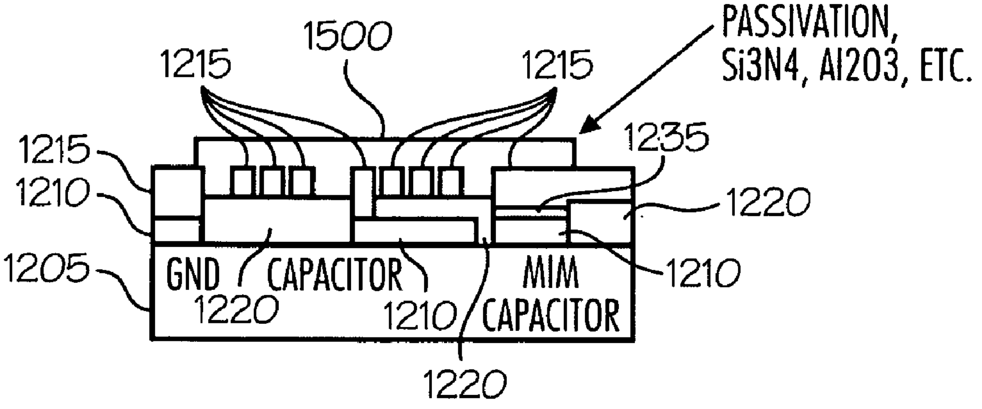
FIG. 15 depicts a cross section of a bandpass filter with a passivation layer according to one embodiment of the invention.

The physical structure of the bandpass filter may also include a passivation layer to help protect the top metal layers of the manufactured chip. FIG. 15 depicts a cross section of a bandpass filter with a passivation layer according to one embodiment of the invention. The passivation layer is applied over the second metal layer 1215 and insulator 1220 at a preferred thickness of 20 μm to 50 μm. Preferably, the passivation layer is made with silicon nitride or aluminum oxide ($Al_2O_3$), but may be any material suitable for providing protection to the top of electronic chips.

Figure 16:
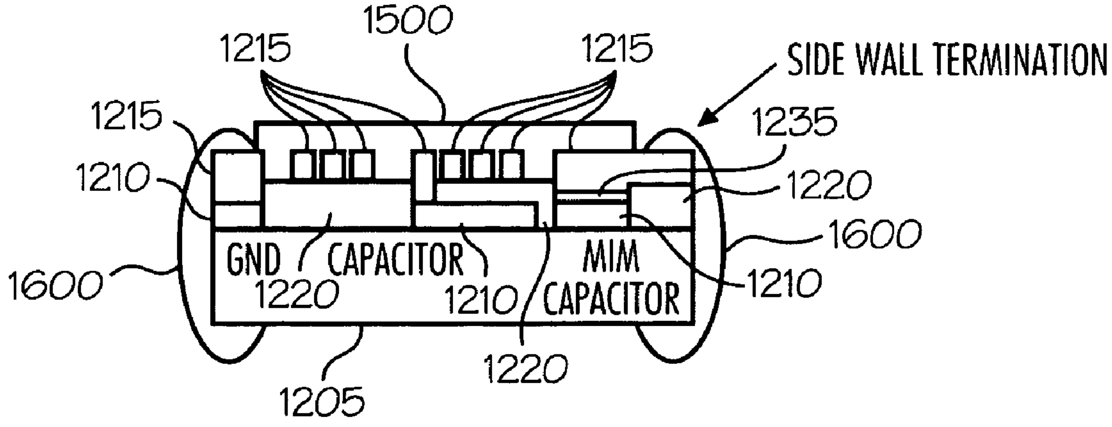
FIG. 16 depicts a cross section of a bandpass filter with sidewall terminations according to one embodiment of the invention.

In addition, the manufactured bandpass filter may include sidewall termination for the input, out, and ground connection. FIG. 16 depicts a cross section of a bandpass filter with sidewall terminations according to one embodiment of the invention. The sidewall terminations are made from tin (may be nickel, then copper, then tin) and are applied to the sides of the bandpass filter package so that they are directly bonded to solder pads on a circuit board. This allows the bandpass filter to take up less room within a device.

Figure 17:
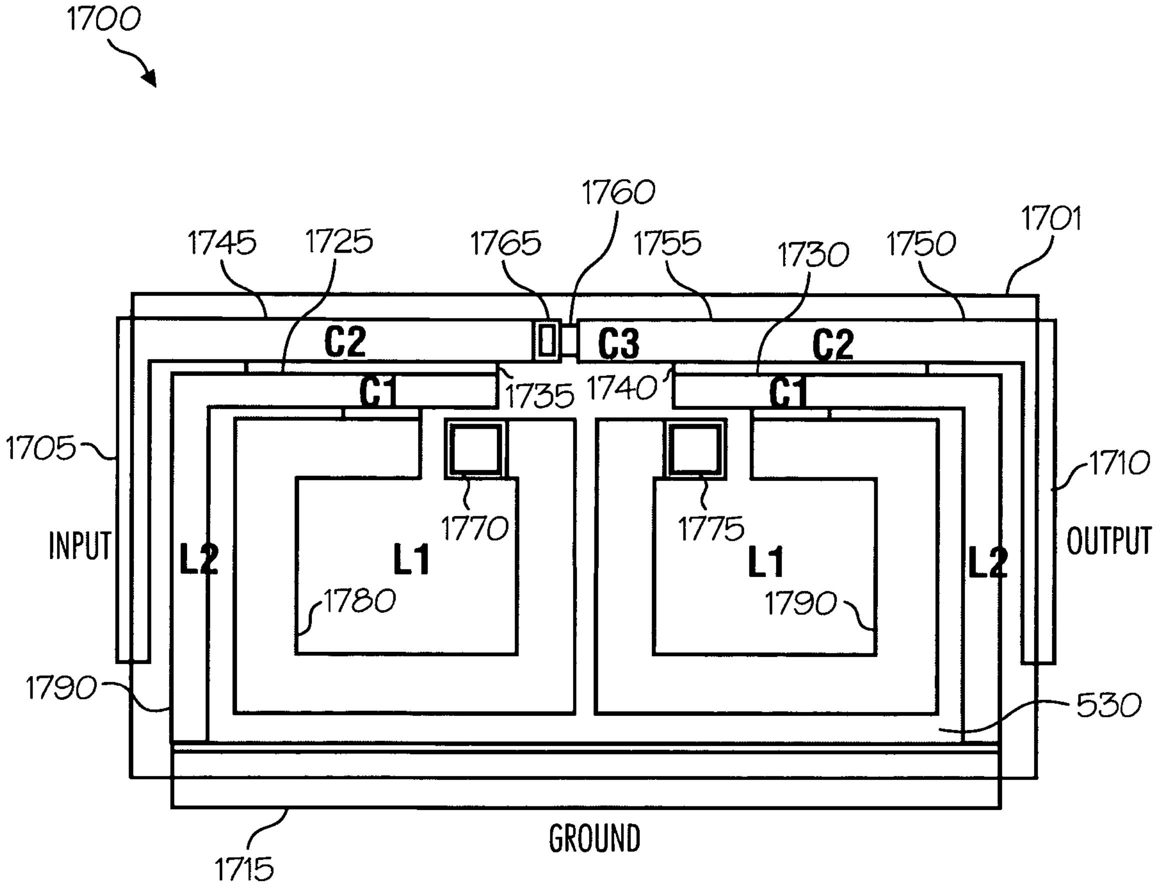
FIG. 17 depicts a physical layout of a bandpass filter with two inductor pairs according to one embodiment of the invention.

As mentioned above, the invention is not limited to specific layout examples shown in FIGS. 1A to 1C and 5A to 5C. FIG. 17 shows one example alternative that utilizes two additional inductors.

As shown in FIG. 17, bandpass filter layout 1700 includes two thin-film layers. Metal regions 1705, 1710, 1715, 1725, 1730, 1745, 1750, 1755, 1790, and 1795 are contained in a top thin-film layer. Metal regions 1735, 1740, 1760, 1780 and 1785 are contained in a bottom thin-film layer. Vias 1765, 1770, and 1775 connect metal regions in the top layer to metal regions in the bottom layer.

Metal regions 1705 and 1710 are the input and output terminals of the bandpass filter respectively. Metal region 1715 is the ground terminal. The portions of these terminals that are outside the filter package when manufactured are shown by line 1701.

Connected to metal region 1705 (input) is metal region 1745. Metal region 1745, together with metal region 1735 on the bottom layer, forms a capacitor (C2). Metal region 1735 is also used to form a capacitor (C1) with metal region 1725. Metal region 1725 is connected to metal region 1715 (ground) through metal region 1790 (L2).

Metal region 1735 (C1/C2) also connects to metal region 1780 (L1) on the bottom layer. Metal region 1780 connects to metal region 1715 (ground) through via 1770.

Moving to the right side of the layout, metal region 1745 (C1) connects to metal region 1760 on the lower layer through via 1765. Metal region 1760, together with metal region 1755 on the upper layer, forms a capacitor (C3). Metal region 1755 connects to metal region 1750. Metal region 1750, together with metal region 1740 on the bottom layer, forms a capacitor (C2). This capacitor has substantially the same capacitance value as the capacitor formed by metal regions 1745 and 1735. Metal region 1740 is also used to form a capacitor (C1) with metal region 1730 on the upper layer. This capacitor has substantially the same capacitance value as the capacitor formed by metal regions 1725 and 1735. Metal region 1730 (C1) connects to ground at metal region 1715 through metal region 1795 (L2). Metal region 1750 (C2) connects to the output terminal at metal region 1710.

Metal region 1740 (C1/C2) also connects to metal region 1785 (L2) on the bottom layer. Metal region 1785 connects to metal region 1715 (ground) through via 1775. The inductance of the coil formed by metal region 1785 has substantially the same as inductance as the coil formed by metal region 1780.

Figure 18:
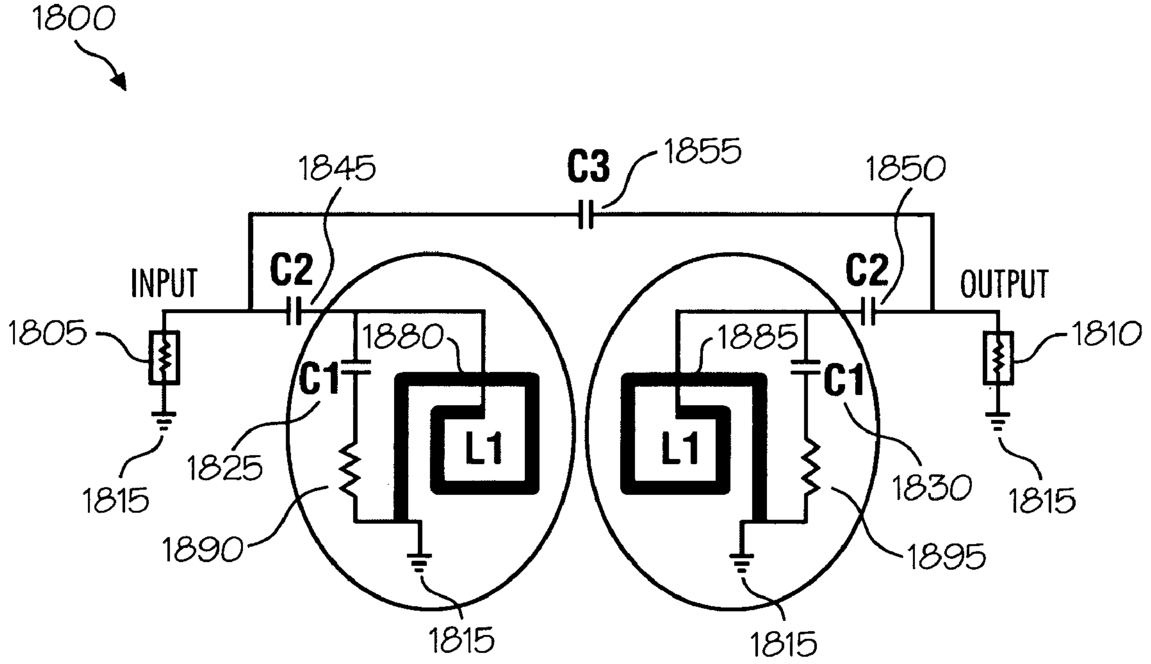
FIG. 18 depicts a schematic, including inductor orientation, of a bandpass filter with two inductor pairs according to one embodiment of the invention.

FIG. 18 depicts a schematic, including inductor orientation, of the bandpass filter layout shown in FIG. 17. Bandpass filter schematic 1800 includes capacitors 1845 and 1850 (C2), capacitors 1825 and 1830 (C1), capacitor 1855 (C3), inductors 1880 and 1885 (L1), and inductors 1890 and 1895 (L2). Capacitors 1845 and 1855 are connected to input terminal 1805. Capacitor 1845 is connected to a first resonant circuit that includes capacitor 1825 and inductor 1890 connected in parallel with inductor 1880.

On the right side, capacitors 1855 and 1850 are connected to output terminal 1810. Capacitor 1850 is also connected to a second resonant circuit that includes capacitor 1830 and inductor 1895 in parallel with inductor 1885. As shown, inductor 1880 has a counter-clockwise rotation while inductor 1885 has a clockwise rotation. This orientation allows for one sections of the inductor coils to be coupled to each other when the filter is energized.

Figure 19:
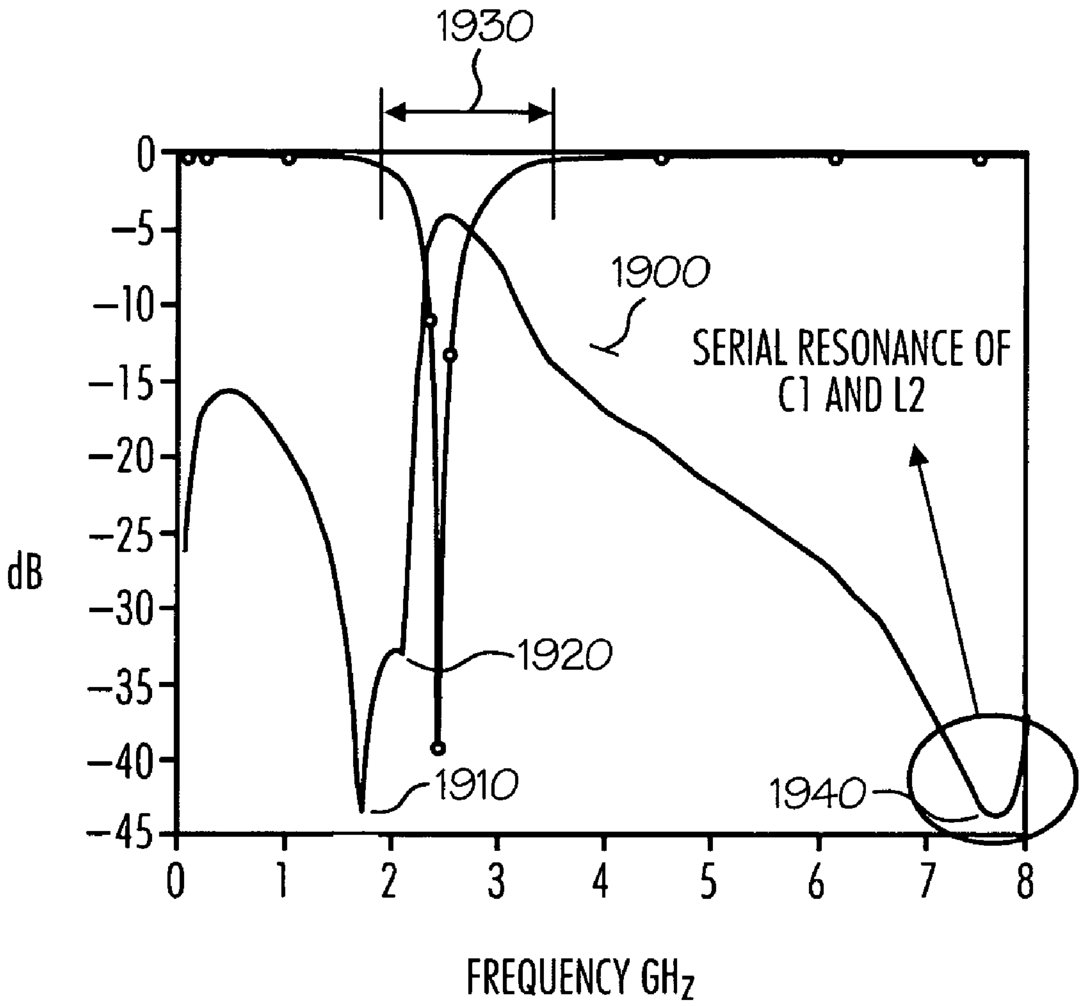
FIG. 19 depicts a frequency response of a bandpass filter with two inductor pairs according to one embodiment of the invention.

FIG. 19 depicts a frequency response of a bandpass filter with the layout of FIG. 17. In this configuration, frequency response 1900 has a passband 1930 between approximately 2.2 to 2.7 GHz. Frequency response 1900 includes two transmission zeros 1910 and 1920 at the lower side of passband 1930 and a transmission zero 1940 at the upper side of passband 1900. As such, by adding inductors in parallel with coil to the layout shown in FIGS. 5A to 5C an additional zero can be added on the upper side of the passband. In this way, increased attenuation and rolloff can be achieved when two transmission zeros are desired on the lower passband side.

Figure 20:
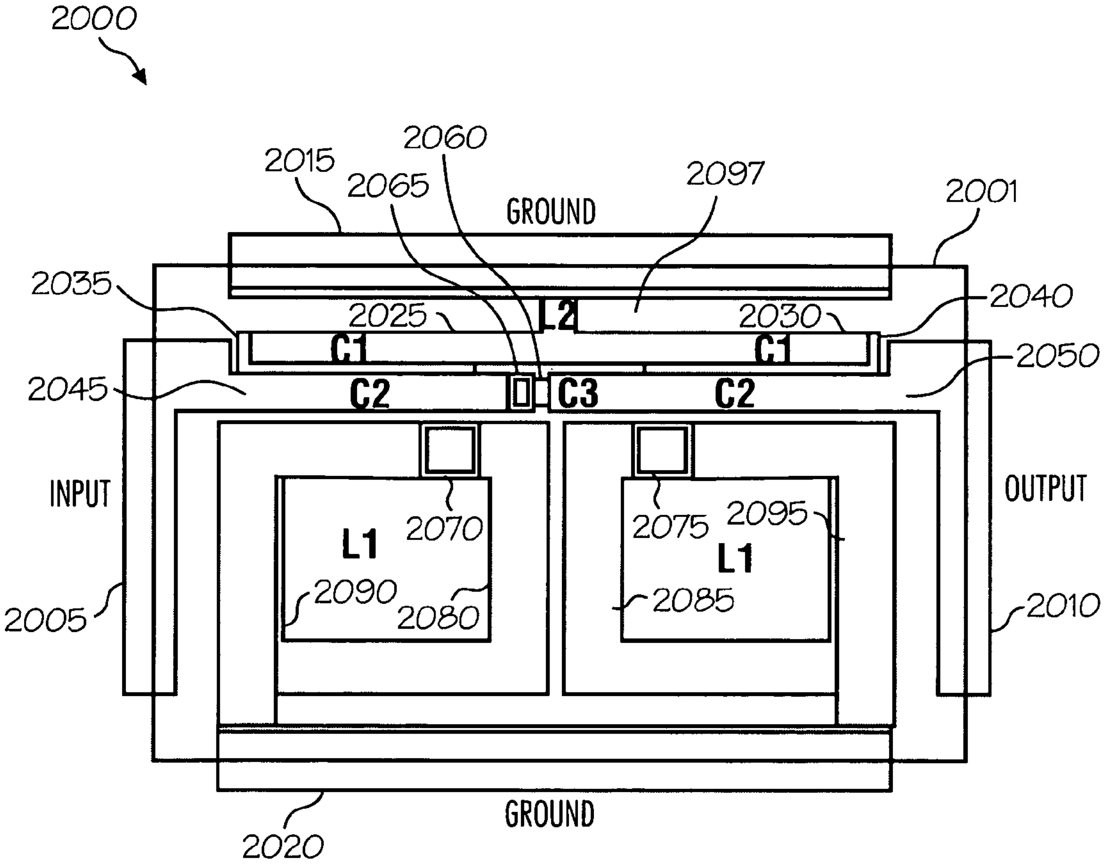
FIG. 20 depicts a physical layout of a bandpass filter with three inductors according to one embodiment of the invention.

FIG. 20 shows another exemplary layout alternative. As shown in FIG. 20, bandpass filter layout 2000 includes two thin-film layers. Metal regions 2005, 2010, 2015, 2020, 2025, 2030, 2045, 2050, 2055, 2090, 2095, and 2097 are contained in a top thin-film layer. Metal regions 2035, 2040, 2060, 2080 and 2085 are contained in a bottom thin-film layer. Vias 2065, 2070, and 2075 connect metal regions in the top layer to metal regions in the bottom layer.

Metal regions 2005 and 2010 are the input and output terminals of the bandpass filter respectively. Metal regions 2015 and 2020 are the ground terminals. The portions of these terminals that are outside the filter package when manufactured are shown by line 2001.

Connected to metal region 2005 (input) is metal region 2045. Metal region 2045, together with metal region 2035 on the bottom layer, forms a capacitor (C2). Metal region 2035 is also used to form a capacitor (C1) with metal region 2025. Metal region 2025 is connected to metal region 2015 (ground) through metal region 2097 (L2).

Metal region 2035 (C1/C2) also connects to metal region 2080 on the bottom layer. Metal region 2080 forms part of the coil of inductor (L1). Metal region 2080 connects to metal region 2090 on the upper layer through via 2070. Metal region 2090 forms the remainder of the coil of the inductor (L1). Metal region 2090 connects to ground at metal region 2020.

Moving to the right side of the layout, metal region 2045 (C2) connects to metal region 2060 on the lower layer through via 2065. Metal region 2060, together with metal region 2055 on the upper layer, forms a capacitor (C3). Metal region 2055 connects to metal region 2050. Metal region 2050, together with metal region 2040 on the bottom layer, forms a capacitor (C2). This capacitor has substantially the same capacitance value as the capacitor formed by metal regions 2045 and 1735. Metal region 2040 is also used to form a capacitor (C1) with metal region 2030 on the upper layer. This capacitor has substantially the same capacitance value as the capacitor formed by metal regions 2025 and 2035. Metal region 2030 (C1) connects to ground at metal region 2015 through metal region 2097 (L2). Metal region 2050 (C2) connects to the output terminal at metal region 2010.

Metal region 2040 (C1/C2) also connects to metal region 2085 on the bottom layer. Metal region 2085 forms part of the coil of inductor (L1). Metal region 2085 connects to metal region 2095 on the upper layer through via 2075. Metal region 2095 forms the remainder of the coil of the inductor (L1). The inductance of the coil formed by metal regions 2085 and 2095 is substantially the same as the inductance of the coil formed by metal regions 2080 and 2090. Metal region 2095 connects to ground at metal region 2020.

The layout of the filter in FIG. 20 is similar to the layout show in FIGS. 5A to 5C except for the addition of an additional inductor L2 connecting the C2 capacitors to ground.

Figure 21:
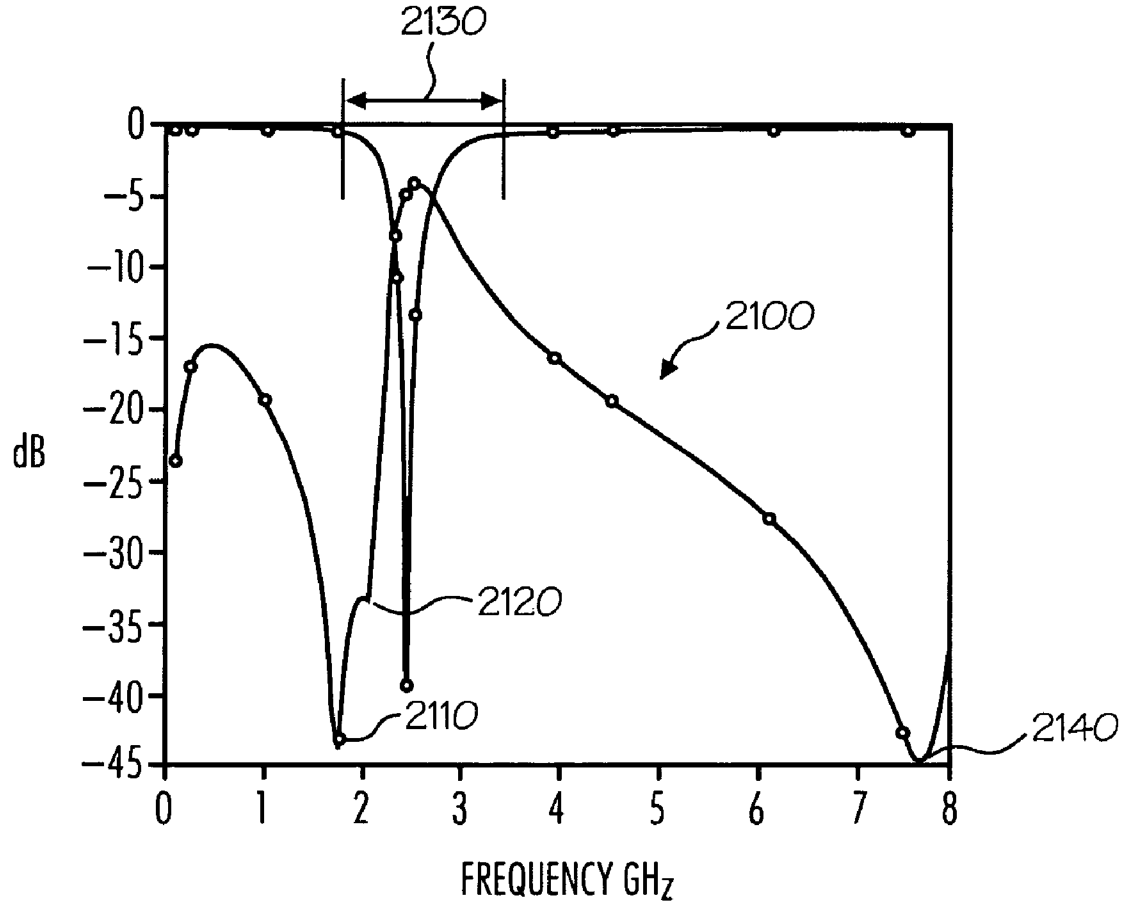
FIG. 21 depicts a frequency response of a bandpass filter with three inductors according to one embodiment of the invention.

FIG. 21 depicts a frequency response of a bandpass filter with the layout of FIG. 20. In this configuration, frequency response 2100 has a passband 2130 between approximately 2.0 to 3.5 GHz. Frequency response 2100 includes two transmission zeros 2110 and 2120 at the lower side of passband 2130. In addition, the frequency response on the upper side of passband 2130 exhibits greater attenuation and a steeper rolloff, as well as a transmission zero 2140. As such, by adding an inductor between the C2 capacitors and ground to the layout shown in FIGS. 5A to 5C, an additional out-band attenuation and rolloff can be improved on the upper passband side.

Other embodiments of the invention will be apparent to those skilled in the art from consideration of the specification and embodiments disclosed herein. Thus, the specification and examples are exemplary only, with the true scope and spirit of the invention set forth in the following claims and legal equivalents thereof.

What is claimed is:

1. A thin-film bandpass filter comprising:

at least two thin-film layers;

a first resonant circuit including a first inductor; and a second resonant circuit including a second inductor;

wherein the first inductor comprises a coil having a counter-clockwise rotation positioned in two or more of the at least two thin-film layers;

wherein the second inductor comprises a coil having a clockwise rotation positioned in two or more of the at least two thin-film layers; and wherein the first inductor is coupled to the second inductor in at least one of the at least two thin-film layers when the bandpass filter is energized.

2. The thin-film bandpass filter of claim 1 wherein the counter-clockwise rotation of the first inductor starts in a lower thin-film layer and finishes in an upper thin-film layer and the clockwise rotation of the second inductor starts in a lower thin-film layer and finishes in an upper thin-film layer.

3. The thin-film bandpass filter of claim 1 wherein the counter-clockwise rotation of the first inductor starts in an upper thin-film layer and finishes in a lower thin-film layer and the clockwise rotation of the second inductor starts in an upper thin-film layer and finishes in a lower thin-film layer.

4. The thin-film bandpass filter of claim 1 wherein the first inductor and the second inductor have a rectangular-coil shape.

5. The thin-film bandpass filter of claim 1 wherein the first inductor and the second inductor have a rounded rectangular-coil shape.

6. The thin-film bandpass filter of claim 1 wherein the first inductor and the second inductor have a round-coil shape.

7. The thin-film bandpass filter of claim 1 comprising two thin-film metal layers.

8. The thin-film bandpass filter of claim 1 further comprising:

a third inductor in parallel with the first inductor; and a fourth inductor in parallel with the second inductor.

9. The thin-film bandpass filter of claim 1 further comprising a third inductor in parallel with first or second resonant circuit.

10. The thin-film bandpass filter of claim 1 wherein the bandpass filter is contained within a thin-film package including sidewall terminating input, output, and ground connections.

11. The thin-film bandpass filter of claim 1 wherein the bandpass filter is contained within a thin-film package that includes a passivation layer.

12. A thin-film bandpass filter comprising:

at least two thin-film layers;

a first resonant circuit including a first inductor; and a second resonant circuit including a second inductor;

wherein the first inductor comprises a coil having a clockwise rotation positioned in two or more of the at least two thin-film layers;

wherein the second inductor comprises a coil having a counter-clockwise rotation positioned in two or more of the at least two thin-film layers; and wherein the first inductor is coupled to the second inductor in at least two of the at least two thin-film layers when the bandpass filter is energized.

13. The thin-film bandpass filter of claim 12 wherein the clockwise rotation of the first inductor starts in a lower thin-film layer and finishes in an upper thin-film layer and the counter-clockwise rotation of the second inductor starts in a lower thin-film layer and finishes in an upper thin-film layer.

14. The thin-film bandpass filter of claim 12 wherein the clockwise rotation of the first inductor starts in an upper thin-film layer and finishes in a lower thin-film layer and the counter-clockwise rotation of the second inductor starts in an upper thin-film layer and finishes in a lower thin-film layer.

15. The thin-film bandpass filter of claim 12 wherein the first inductor and the second inductor have a rectangular-coil shape.

16. The thin-film bandpass filter of claim 12 wherein the first inductor and the second inductor have a rounded rectangular-coil shape.

17. The thin-film bandpass filter of claim 12 wherein the first inductor and the second inductor have a round-coil shape.

18. The thin-film bandpass filter of claim 12 comprising two thin-film metal layers.

19. The thin-film bandpass filter of claim 12 further comprising:

a third inductor in parallel with the first inductor; and a fourth inductor in parallel with the second inductor.

20. The thin-film bandpass filter of claim 12 further comprising a third inductor in parallel with first or second resonant circuit.

21. The thin-film bandpass filter of claim 12 wherein the bandpass filter is contained within a thin-film package including sidewall terminating input, output, and ground connections.

22. The thin-film bandpass filter of claim 12 wherein the bandpass filter is contained within a thin-film package that includes a passivation layer.

23. A thin-film bandpass filter comprising:

at least two thin-film layers, including a first thin-film layer and a second thin-film layer;

a first inductor and a first capacitor forming a first resonant circuit;

a second inductor and a second capacitor forming a second resonant circuit;

an input capacitor connected between the first resonant circuit and an input terminal;

an output capacitor connected between the second resonant circuit and an output terminal; and a coupling capacitor connected between the input terminal and the output terminal;

wherein the first inductor is comprised of a counter-clockwise turning coil starting at the first thin-film layer and finishing at the second thin-film layer, the first inductor being connected to the input capacitor and the first capacitor at the first thin-film layer and being connected to ground at the second thin-film layer;

wherein the second inductor is comprised of a clockwise turning coil starting at the first thin-film layer and finishing at the second thin-film layer, the second inductor being connected to the output capacitor and the second capacitor at the first thin-film layer and being connected to ground at the second thin-film layer; and wherein at least a portion of the coils of the first and second inductors are coupled in either the first thin-film layer or the second thin-film layer.

24. A thin-film bandpass filter comprising:

at least two thin-film layers, including a first thin-film layer and a second thin-film layer;

a first inductor and a first capacitor forming a first resonant circuit;

a second inductor and a second capacitor forming a second resonant circuit;

an input capacitor connected between the first resonant circuit and an input terminal;

an output capacitor connected between the second resonant circuit and an output terminal; and a coupling capacitor connected between the input terminal and the output terminal;

wherein the first inductor is comprised of a clockwise turning coil starting at the first thin-film layer and finishing at the second thin-film layer, the first inductor being connected to the input capacitor and the first capacitor at the first thin-film layer and being connected to ground at the second thin-film layer;

wherein the second inductor is comprised of a counter-clockwise turning coil starting at the first thin-film layer and finishing at the second thin-film layer, the second inductor being connected to the output capacitor and the second capacitor at the first thin-film layer and being connected to ground at the second thin-film layer; and wherein at least a portion of the coils of the first and second inductors are coupled in at least the first thin-film layer and the second thin-film layer.

* * * * *